(12) United States Patent
Jung et al.

(10) Patent No.: US 10,840,191 B2
(45) Date of Patent: Nov. 17, 2020

(54) FILM PACKAGE AND PACKAGE MODULE INCLUDING THE SAME

(71) Applicant: SAMSUNG ELECTRONICS CO., LTD., Suwon-si (KR)

(72) Inventors: Jae-Min Jung, Seoul (KR); JiAh Min, Yeongdong-eup (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/814,528

(22) Filed: Mar. 10, 2020

(65) Prior Publication Data

US 2020/0211973 A1  Jul. 2, 2020

Related U.S. Application Data

(63) Continuation of application No. 16/241,116, filed on Jan. 7, 2019, now Pat. No. 10,643,948.

(30) Foreign Application Priority Data

May 28, 2018  (KR) .................. 10-2018-0060651

(51) Int. Cl.
    *H01L 23/538*  (2006.01)
    *H01L 21/48*   (2006.01)
    *H01L 21/56*   (2006.01)
    *H01L 23/31*   (2006.01)
    *H01L 23/367*  (2006.01)
    (Continued)

(52) U.S. Cl.
    CPC ...... *H01L 23/5387* (2013.01); *H01L 21/4853* (2013.01); *H01L 21/563* (2013.01); *H01L 23/3135* (2013.01); *H01L 23/3675* (2013.01); *H01L 23/5386* (2013.01); *H01L 23/552* (2013.01); *H01L 24/16* (2013.01); *H01L 2224/16227* (2013.01); *H01L 2924/1426* (2013.01); *H01L 2924/3025* (2013.01)

(58) Field of Classification Search
    CPC .................................................. H01L 23/5387
    See application file for complete search history.

(56) References Cited

U.S. PATENT DOCUMENTS

| | | | |
|---|---|---|---|
| 5,422,515 A | 6/1995 | Endo | |
| 5,448,106 A | 9/1995 | Fujitsu | |
| 5,448,451 A | 9/1995 | Takubo et al. | |
| (Continued) | | | |

FOREIGN PATENT DOCUMENTS

| | | |
|---|---|---|
| JP | 3061954 B2 | 7/2000 |
| JP | 2009194355 A | 8/2009 |
| (Continued) | | |

OTHER PUBLICATIONS

European search report dated Oct. 23, 2019.

*Primary Examiner* — William Coleman
(74) *Attorney, Agent, or Firm* — Volentine, Whitt & Francos, PLLC

(57) ABSTRACT

A film package includes a film substrate, a first semiconductor chip on a first surface of the film substrate, a second semiconductor chip on the first surface of the film substrate, and a first conductive film on the first surface of the film substrate. The first conductive film covers the first semiconductor chip and the second semiconductor chip and includes a slit(s) or a notch(es). The slit(s) or notch(es) is/are disposed in a bridge region between the first semiconductor chip and the second semiconductor chip, in a plan view of the package.

20 Claims, 26 Drawing Sheets

(51) Int. Cl.
*H01L 23/552* (2006.01)
*H01L 23/00* (2006.01)

(56) References Cited

U.S. PATENT DOCUMENTS

| | | |
|---|---|---|
| 6,998,707 B2 | 2/2006 | Fukuda et al. |
| 9,054,119 B2 | 6/2015 | Hauenstein |
| 2007/0211426 A1 | 9/2007 | Clayton et al. |
| 2013/0161616 A1 | 6/2013 | Hsu et al. |
| 2016/0056091 A1 | 2/2016 | Kim et al. |

FOREIGN PATENT DOCUMENTS

| | | |
|---|---|---|
| JP | 5193431 B2 | 5/2013 |
| JP | 5466966 B2 | 4/2014 |
| KR | 20040076028 A | 8/2004 |
| KR | 100658442 B1 | 12/2006 |
| TW | 201327728 A | 7/2013 |

FILM PACKAGE AND PACKAGE MODULE INCLUDING THE SAME

PRIORITY STATEMENT

This is a Continuation of U.S. application Ser. No. 16/241,116, filed Jan. 7, 2019, which claims priority under 35 U.S.C. § 119 to Korean Patent Application No. 10-2018-0060651 filed on May 28, 2018 in the Korean Intellectual Property Office, the disclosure of which is hereby incorporated by reference in its entirety.

BACKGROUND

1. Field

The inventive concept relates to a semiconductor package and, more specifically, to a chip-on-film package and a package module including the same.

2. Description of the Related Art

In accordance with the trend to miniaturize and reduce the thickness and weight of electronic devices, a chip-on-film (COF) package technology using a flexible film substrate has been used. The COF package technology is characterized in that a semiconductor chip is mounted on the film substrate by a flip chip bonding method and is connected to an external circuit by a short lead wiring. A COF package may be applied to a mobile device, such as a cellular phone, a PDA, or a laptop computer, or a display device.

SUMMARY

According to the inventive concept, a film package may include a film substrate having a first surface and a second surface that are opposite to each other, a first semiconductor chip on the first surface of the film substrate, a second semiconductor chip on the first surface of the film substrate, the second semiconductor chip spaced apart from the first semiconductor chip, and a first conductive film on the first surface of the film substrate. The first conductive film covers the first semiconductor chip and the second semiconductor chip and has at least one slit or at least one notch therein. Also, each slit or each notch extends in a region of the first conductive film that is between the first semiconductor chip and the second semiconductor chip and delimited by and between a first side and a second side of the first conductive film that are opposite to each other, in a plan view of the film package.

According to another example of the inventive concept, a film package may include a film substrate, a first semiconductor chip on a first surface of the film substrate, a second semiconductor chip on the first surface of the film substrate, the second semiconductor chip spaced apart from the first semiconductor chip, and a first film structure on the first surface of the film substrate and covering the first semiconductor chip and the second semiconductor chip. The first film structure comprises a metal or a carbon-containing material. The first film structure has a bridge region disposed between the first semiconductor chip and the second semiconductor chip and delimited by and between a first side and a second side of the first film structure that are opposite to each other, in a plan view of the film package. Also, the bridge region has at least one slit or at least one notch therein.

According to another example of the inventive concept, a chip on film package may include a substrate comprising a flexible film of material and having opposite first and second surfaces, a first semiconductor chip on the first surface of the substrate, a second semiconductor chip on the first surface of the substrate as spaced apart from the first semiconductor chip in a first direction, and a film structure comprising a conductive film on the first surface of the substrate and in which side and upper surfaces of the first semiconductor chip and the second semiconductor chip are wrapped. The film structure has a first side and a second side that are spaced from each other in a second direction perpendicular to the first direction. The film structure has a first chip region at which the conductive film covers the first semiconductor chip, a second chip region at which the conductive film covers the second semiconductor chip and a bridge region between the first chip region and the second chip region, as viewed in a plan view of the COF package. Also, the film structure has at least one slit extending through the bridge region as spaced from the first side and the second side of the film structure or the film structure has at least one notch extending in the bridge region from one of the first side and the second side of the film structure.

According to another example of the inventive concept, a package module includes a display device and a film package electrically connected to the display device. The film package may comprise a film substrate having a first surface and a second surface that are opposite to each other, a first semiconductor chip on the first surface of the film substrate, and a second semiconductor chip on the first surface of the film substrate, and in which the second semiconductor chip is spaced apart from the first semiconductor chip, and a first thermal dissipation film structure is disposed on the first surface of the film substrate. The first thermal dissipation film structure covers the first semiconductor chip and the second semiconductor chip and includes at least one slit or notch. The slit(s) or notch(es) are disposed in a bridge region of the first thermal dissipation film structure. The bridge region of the first thermal dissipation film structure is disposed between the first semiconductor chip and the second semiconductor chip and between a first side and a second side of the first thermal dissipation film structure that are opposite to each other, in a plan view of the package.

BRIEF DESCRIPTION OF THE DRAWINGS

FIGS. 3A-4D illustrate an example of a method of manufacturing a film package according to the inventive concept, in which:

FIGS. 3A and 4A are plan views of the film package during the course of its manufacture and correspond to enlarged views of region I of FIG. 1;

FIGS. 3D and 4D are cross-sectional views taken along lines IV-IV' OF FIGS. 3A and 4A, respectively.

DETAILED DESCRIPTION

Various examples of the inventive concept will now be described more fully with reference to the accompanying drawings. However, the inventive concept may be embodied in many alternate forms and should not be construed as limited to only examples described in detail herein.

Figure 1:
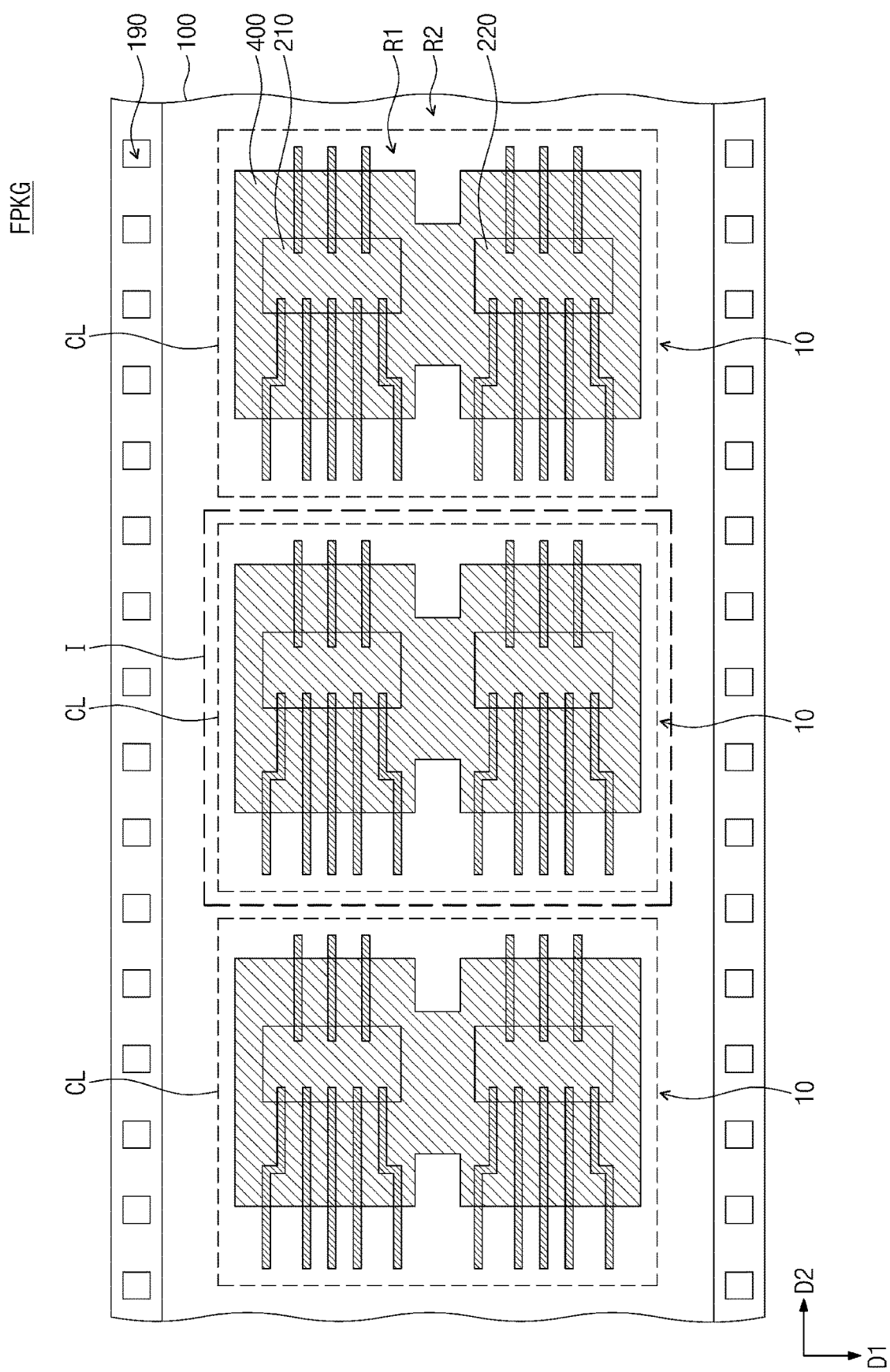
FIG. 1 is a layout diagram of examples of a film package according to the inventive concept.

FIG. 1 illustrates a layout of examples of a film package according to the inventive concept.

Referring to FIG. 1, a film package (FPKG) according to the inventive concept may include a film substrate 100, a first semiconductor chip 210, a second semiconductor chip 220, and a first film structure 400. The film substrate 100 may be of a polymer material, e.g., polyimide or polyester. The film substrate 100 may be flexible. In a plan view, sprocket holes 190 may be arranged along an edge (or a perimeter) of the film substrate 100 in a second direction D2 parallel to an upper surface of the first semiconductor chip 210. The sprocket holes 190 may penetrate the film substrate 100. The film package (FPKG) may be wound using the sprocket holes 190. The film substrate 100 may include first regions R1 and a second region R2. A cut Line CL may be provided between the first regions R1 and the second region R2 to define the first regions R1. In the film package (FPKG), the cut line CL may be a virtual line. The first regions R1 may be arranged along the second direction D2. The second region R2 may surround the first regions RE The first semiconductor chip 210 and the second semiconductor chip 220 may be mounted on the first regions R1 of the film substrate 100. The first film structure 400 may be provided on each of the first regions R1 of the film substrate 100. The first regions R1 of the film substrate 100 and elements on the first regions R1 may constitute unit film packages. Hereinafter, a single unit film package 10 and the first film structure 400 will be described in detail.

Figure 2A:
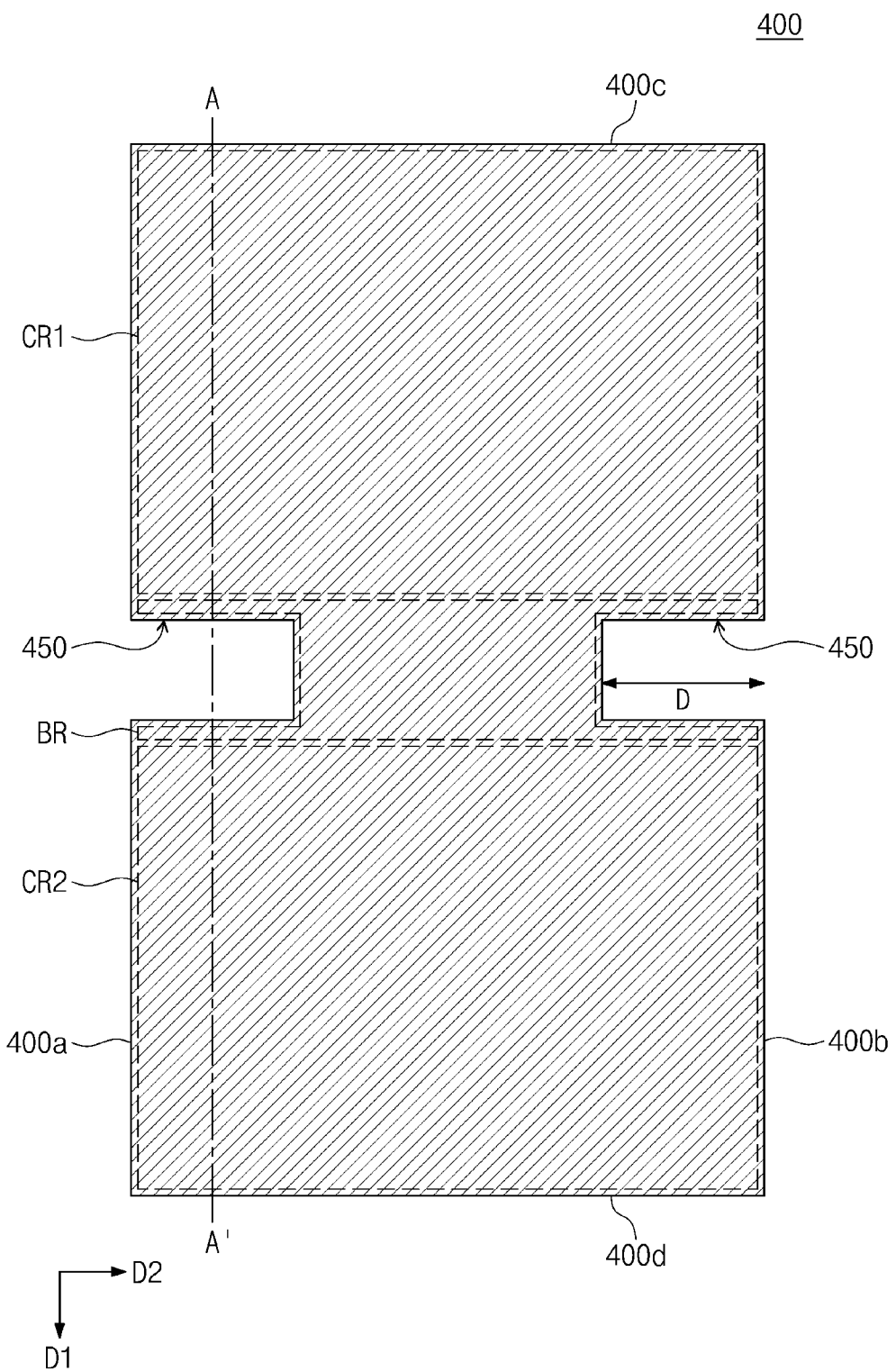
FIG. 2A is a plan view of an example of a first film structure of a film package according to the inventive concept.
Figure 2B:
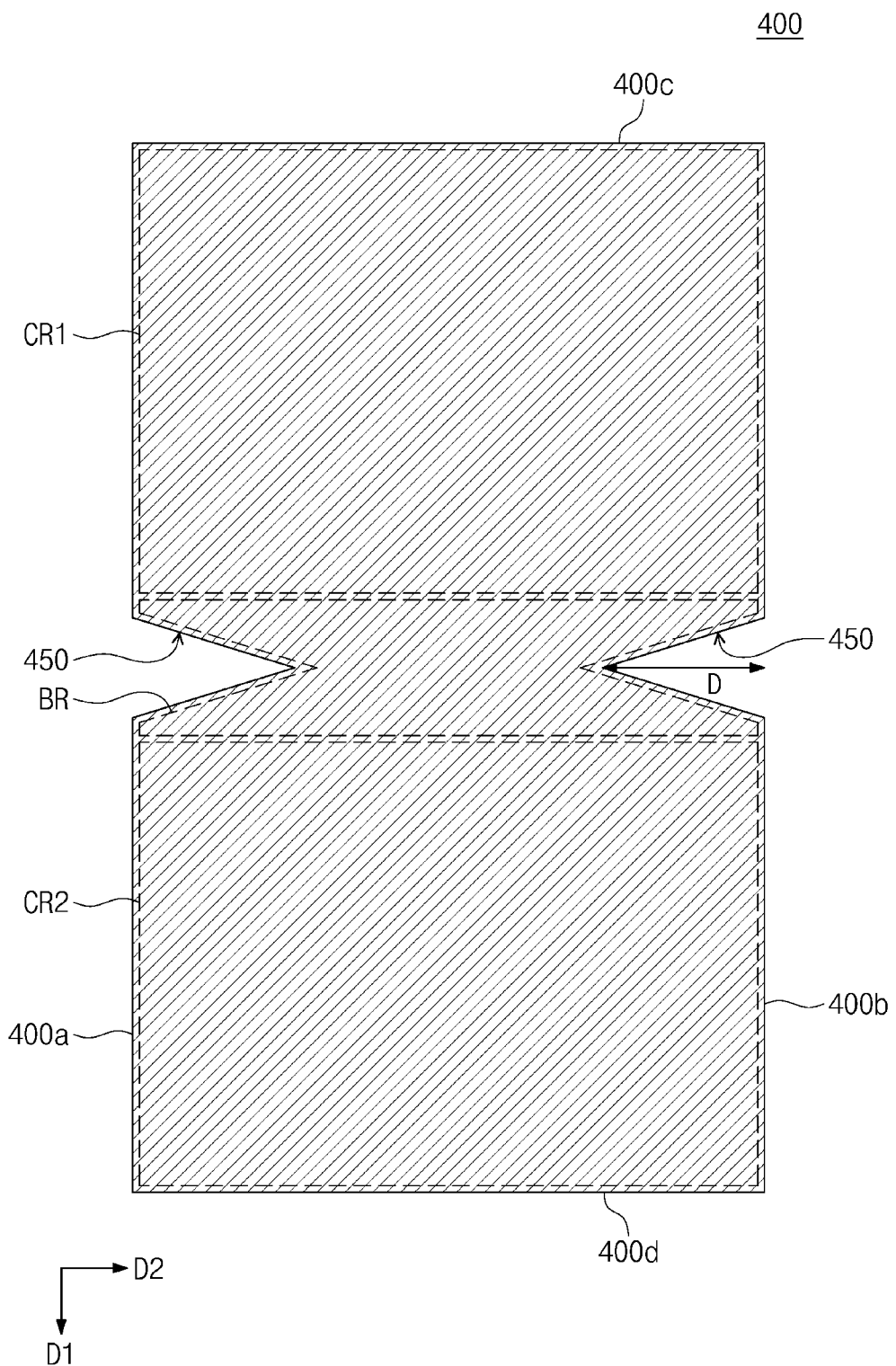
FIG. 2B is a plan view of another example of a first film structure of a film package according to the inventive concept.
Figure 2C:
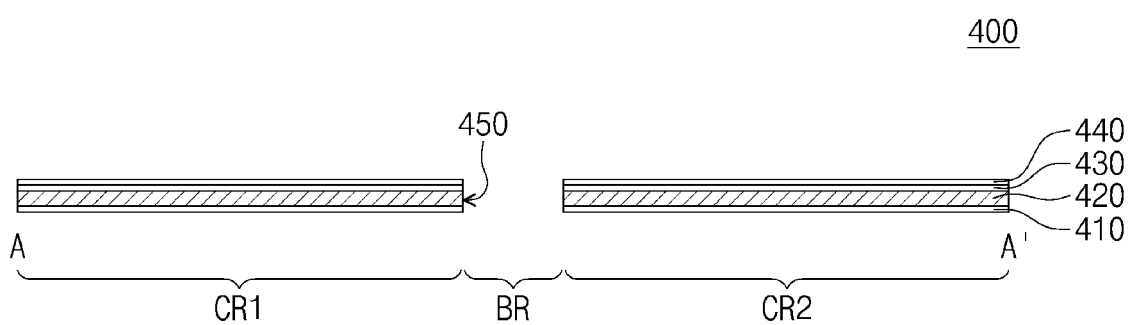
FIG. 2C is a cross-sectional view taken along line A-A' of FIG. 2A.

FIG. 2A is a plan view of a first film structure of a unit film package. FIG. 2B is a plan view of another example of the first film structure. FIG. 2C is a cross-sectional view taken along line A-A' of FIG. 2A.

Referring to FIGS. 2A, 2B, and 2C, the first film structure 400 may have a first side 400a, a second side 400b, a third side 400c, and a fourth side 400d. The first side 400a and the second side 400b of the first film structure 400 may be opposite to each other and may be parallel to a first direction D1 parallel to the upper surface of the first semiconductor chip 210 and crossing the second direction D2. The second side 400b of the first film structure 400 may be remote from the first side 400a thereof in the second direction D2. The third side 400c and the fourth side 400d of the first film structure 400 may be opposite to each other and may be parallel to the second direction D2.

The first film structure 400 may include a first chip region CR1, a second chip region CR2, and a bridge region BR, in a plan view. The first chip region CR1 may be adjacent to the third side 400c of the first film structure 400. The second chip region CR2 may be adjacent to the fourth side 400d of the first film structure 400. The bridge region BR of the first film structure 400 may be disposed between the first chip region CR1 and the second chip region CR2.

A notch 450 may be present in the bridge region BR. The notch 450 may extend in the first side 400a and/or the second side 400b of the first film structure 400. The notch 450 may have a first depth D. In the case in which the notch 450 is provided in a side of the first film structure 400, the first depth D refers to a maximum distance between the side of the first film structure 400 and a bottom of the notch 450. The side of the first film structure 400 may be the first side 400a or the second side 400b of the first film structure 400. The first depth D may be a dimension of the notch 450 measured in the second direction D2. As shown in FIG. 2A, the notch 450 may have a rectangular polygonal profile as viewed in a plan view. Also, a portion of the bridge region BR may be interposed between rectangular sections of the notch 450. The rectangular notch 450 may be formed by cutting the first side 400a and/or the second side 400b of the first film structure 400. As shown in FIG. 2B, the notch 450 may have a triangular polygonal profile. The triangular notch may also be formed by cutting the first side 400a and/or the second side 400b. The notch 450 may have other polygonal profiles or may have a hemi-circular profile. A plurality of notches 450 may be formed in each of the first side 400a and/or the second side 400b of the first film structure 400. That is, the number and the shape of the notches 450 may differ from those shown in the drawings.

As shown in FIG. 2C, the first film structure 400 may include a first lower adhesive film 410, a first conductive film 420, a first upper adhesive film 430, and a first protective film 440. The first lower adhesive film 410 may have an insulation characteristic. As used herein, the term "insulation" means an electrical insulation. The first lower adhesive film 410 may include an epoxy-based polymer, an acrylic-based polymer, or a silicone material.

The first conductive film 420 may be disposed on the first lower adhesive film 410. As used herein, the term "conductive" means a thermal conductivity and/or an electrical conductivity. The first conductive film 420 may have a relatively high thermal conduction rate, thus exhibiting a thermal conductivity. The first conductive film 420 may have a thermal conductivity of 200 W/m·K or more, e.g., 200 W/m·K to 100,000 W/mk. The first conductive film 420 may have an electrical conductivity. The first conductive film 420 may comprise a metal, e.g., aluminum and/or copper. In some examples, the first conductive film 420 comprises a carbon-containing material, e.g., graphene, carbon nanotubes, and/or graphite.

The first upper adhesive film 430 may be disposed on the first conductive film 420. The first upper adhesive film 430 may have an insulation characteristic. The first upper adhesive film 430 may include an epoxy-based polymer, an acrylic-based polymer, or a silicone material.

The first protective film 440 may be disposed on the first upper adhesive film 430. The first protective film 440 may be attached to the first conductive film 420 by the first upper adhesive film 430. The first protective film 440 may prevent the first conductive film 420 from being damaged (e.g., oxidized or corroded) by an external impurity. The external impurity may be oxygen or moisture. The first protective film 440 may include an insulating polymer material. The insulating polymer material may be polyimide, poly(ethyleneterephtalate) (PET) and/or poly(ethylene naphthalate) (PEN). The notch 450 may be formed by cutting the first lower adhesive film 410, the first conductive film 420, the first upper adhesive film 430, and the first protective film 440.

Figure 2D:
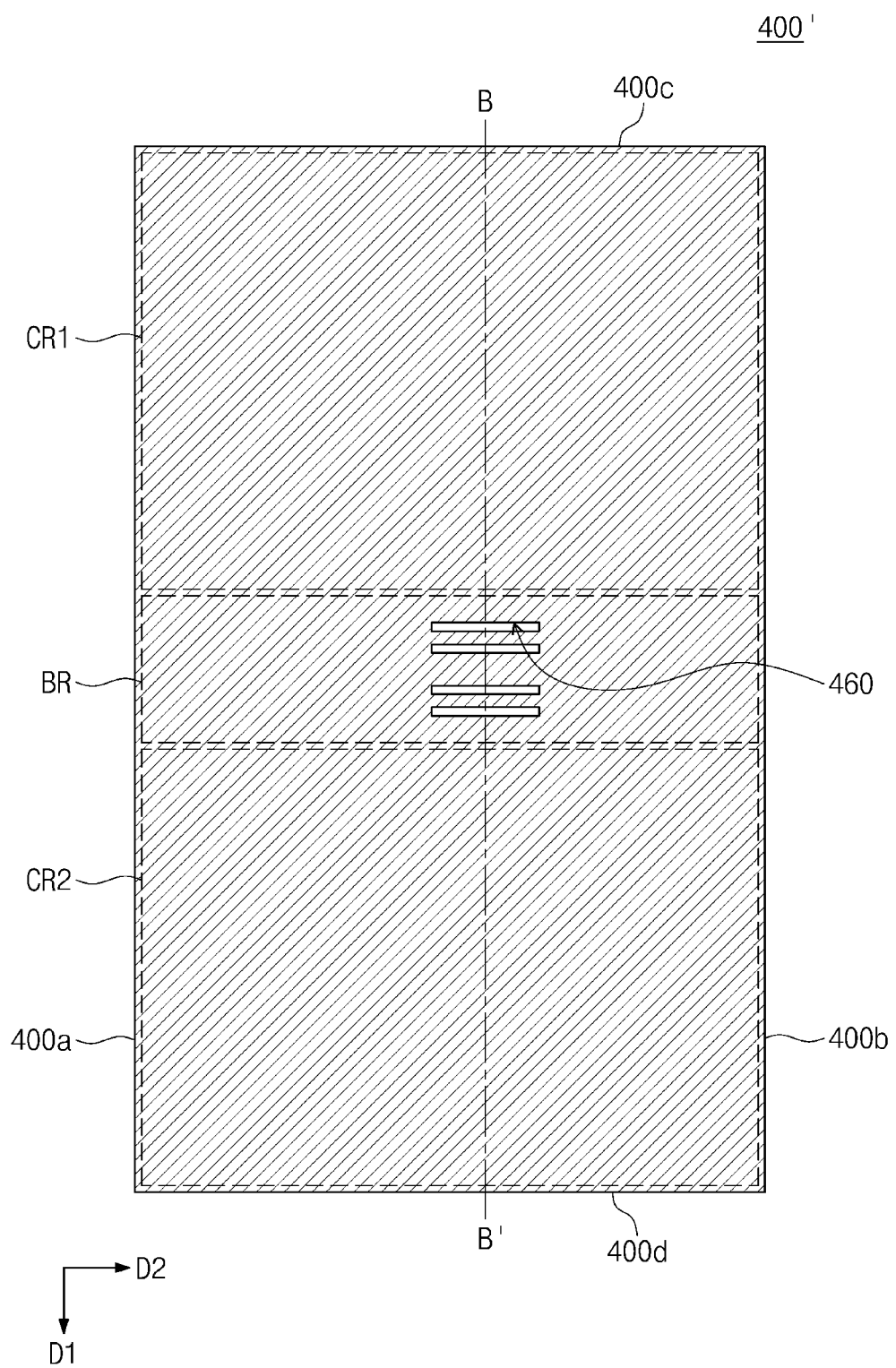
FIG. 2D is a plan view of another example of a first film structure of a film package according to the inventive concept.
Figure 2E:
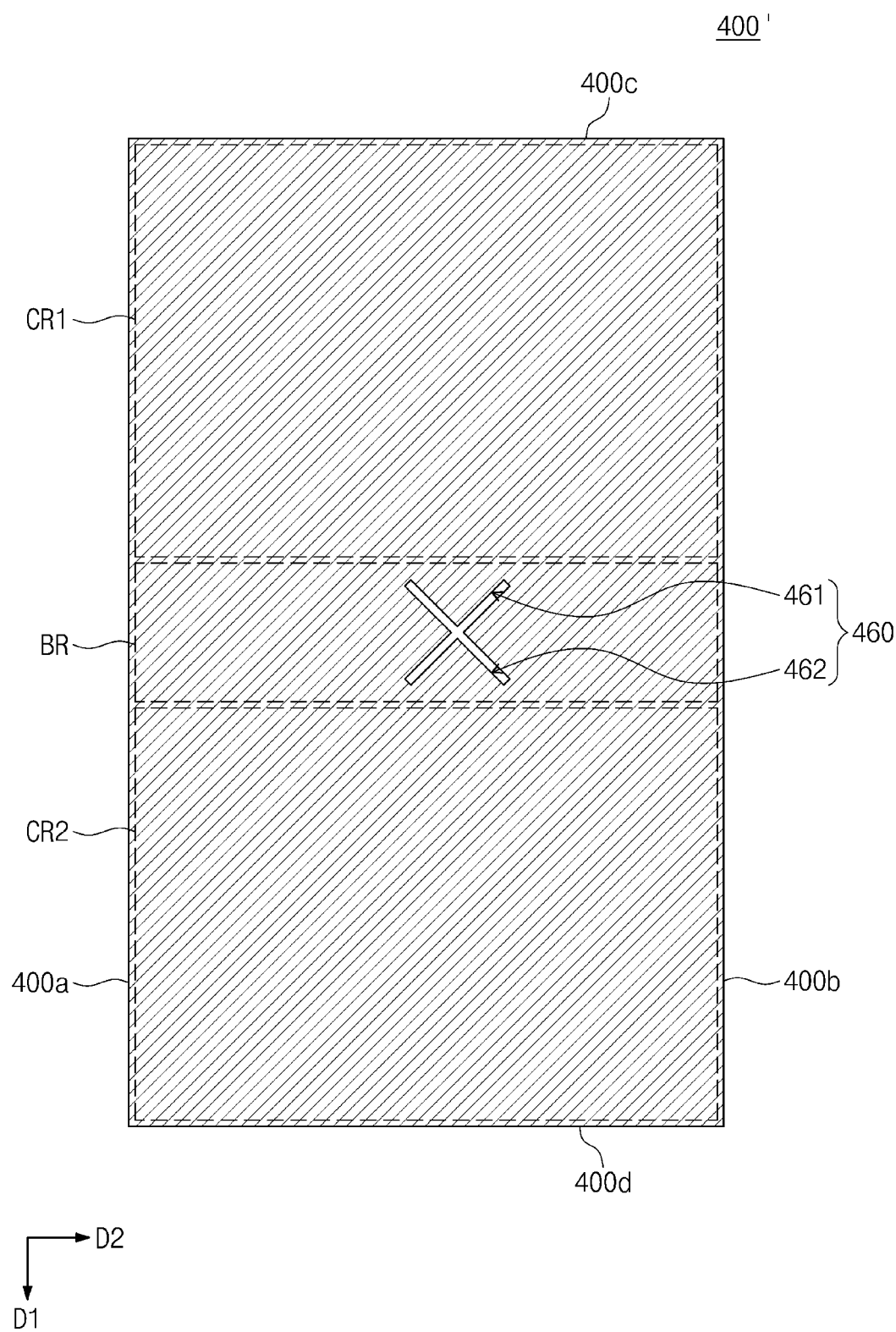
FIG. 2E is a plan view of another example of a first film structure of a film package according to the inventive concept.
Figure 2F:
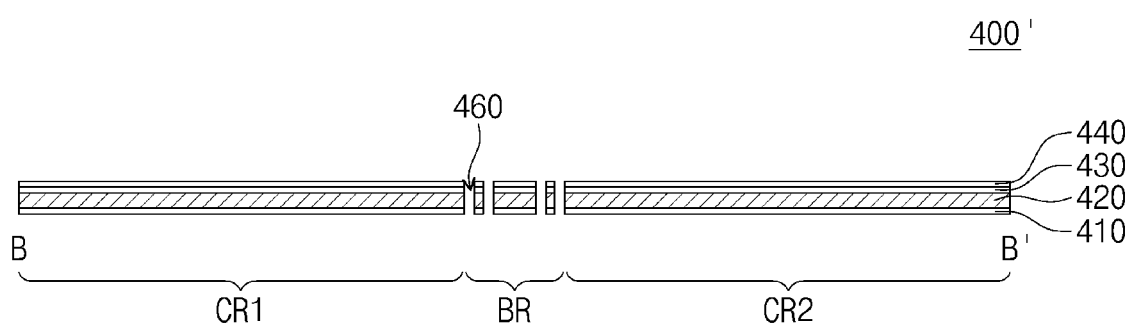
FIG. 2F is a cross-sectional view taken along line B-B' of FIG. 2D.

FIGS. 2D-2F illustrate another example of the first film structure.

Referring to FIGS. 2D, 2E, and 2F, the first film structure 400' may include the first chip region CR1, the second chip region CR2, and the bridge region BR. The first film structure 400' may include the first lower adhesive film 410, the first conductive film 420, the first upper adhesive film 430, and the first protective film 440, as best shown in FIG. 2F.

A slit 460 may be disposed in the bridge region BR. The slit 460 may extend through the first film structure 400'. That is, the slit 460 may extend through each of the first lower adhesive film 410, the first conductive film 420, the first upper adhesive film 430, and the first protective film 440.

As best shown in FIG. 2D, the slit 460 may have a bar shape having a major axis in the second direction D2. A plurality of slits 460 may be disposed in the first film structure 400'. Each of the plurality of slits 460 may have a major axis in the second direction D2. In some examples, the slit 460 extends (i.e., has lengthwise dimension) in the first direction D1.

As shown in FIG. 2E, the slit 460 may have an X shape in a plan view. That is, the slit 460 may include a first section 461 having a major axis and a second section 462 having a major axis extending in a direction different from the major axis of the first section 461. The second section 462 is open to the first section 461. The precise shape, orientation and number of the X-shaped slits 460 may differ from those shown in FIGS. 2D and 2E.

Figure 3A:
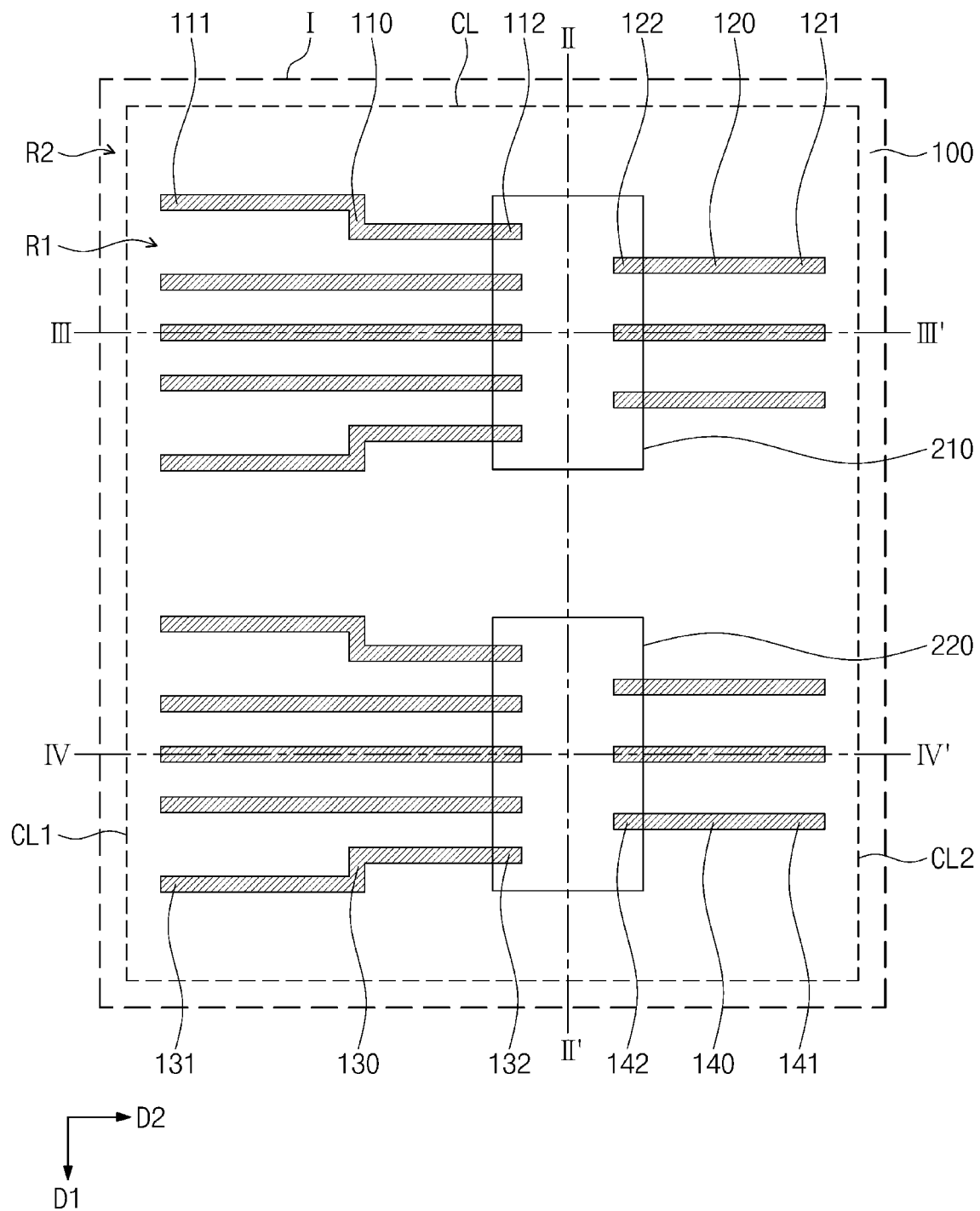
Figure 3B:
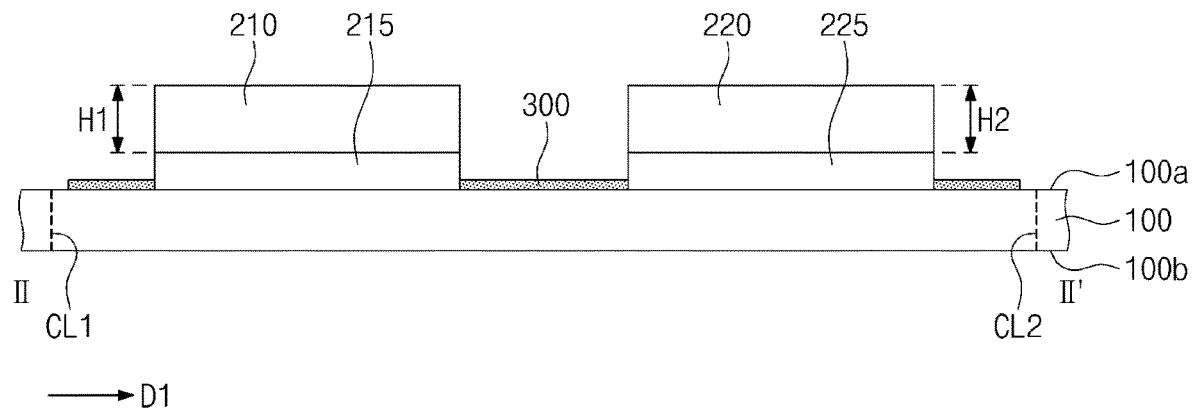
FIGS. 3B and 4B are cross-sectional views taken along lines II-II' OF FIGS. 3A and 4A, respectively.
Figure 3C:
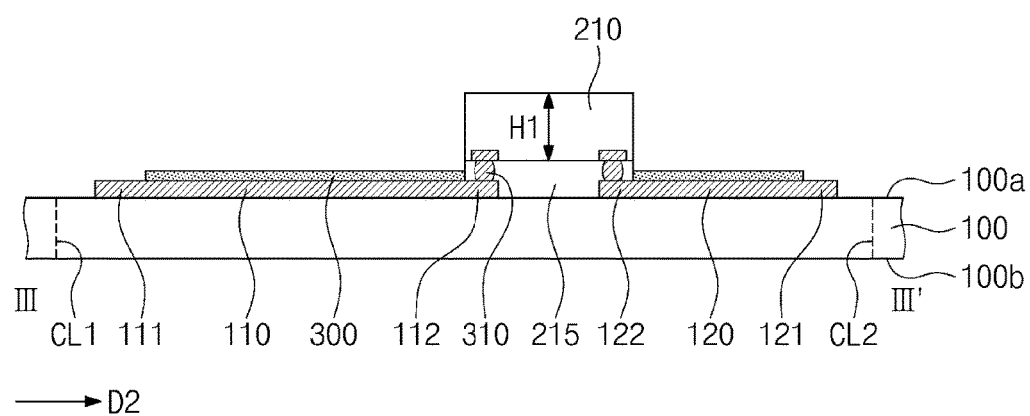
FIGS. 3C and 4C are cross-sectional views taken along lines III-III' OF FIGS. 3A and 4A, respectively.
Figure 3D:
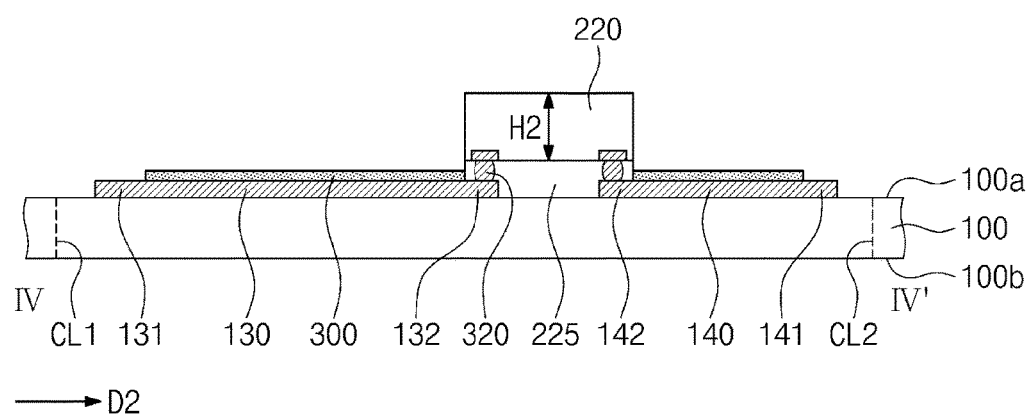

A method of manufacturing a film package according to the inventive concept will now be described with reference to FIGS. 3A-4D. FIG. 4E is a cross-sectional view of a film package for comparison with film packages according to the inventive concept as manufactured by the method shown in FIGS. 3A-4D.

Referring to FIGS. 1, 3A, 3B, 3C, and 3D, the film substrate 100 on which the first semiconductor chip 210 and the second semiconductor chip 220 are mounted may be prepared. The cut line CL may include a first cut line CL1 and a second cut line CL2 that are opposite to each other. The first cut line CL1 and the second cut line CL2 may be parallel to each other in the first direction D1 in a plan view. The second cut line CL2 may be connected to the first cut line CL1. The film substrate 100 may have a first surface 100a and a second surface 100b that are opposite to each other.

The first semiconductor chip 210 may be mounted on the first surface 100a of the film substrate 100. The first semiconductor chip 210 may have a first height HE A first wiring line 110 may be disposed on the first surface 100a of the film substrate 100. As shown in FIG. 3A, a plurality of first output wiring lines 110 may be formed as spaced apart from each other. The first output wiring lines 110 may be electrically separated from each other. Each of the first output wiring lines 110 may have a first end 111 and a second end 112. The first end 111 of each first output wiring line 110 may be adjacent to the first cut line CL1 of the film substrate 100. The second end 112 of each first output wiring line 110 may overlap the first semiconductor chip 210, in a plan view. As shown in FIG. 3C, at least one first connection terminal 310 may be disposed between the second end 112 of each first output wiring line 110 and the first semiconductor chip 210. The first semiconductor chip 210 may be electrically connected to the first output wiring line 110 through the first connection terminal 310. The first connection terminal 310 may include at least one of a pad of solder, a pillar, and a bump. The first connection terminal 310 may comprise metal.

A first input wiring line 120 may be disposed on the first surface 100a of the film substrate 100. The first input wiring line 120 may be spaced apart and electrically separated from the first output wiring line 110. A plurality of first input wiring lines 120 may be provided. The first input wiring lines 120 may be spaced apart from each other and may be electrically separated from each other. Each of the first input wiring lines 120 may have a first end 121 and a second end 122. The first end 121 of the first input wiring line 120 may be adjacent to the second cut line CL2 of the film substrate 100. The second end 122 of the first input wiring line 120 may overlap the first semiconductor chip 210, in a plan view. As shown in FIG. 3C, another first connection terminal 310 may be disposed between the second end 122 of the first input wiring line 120 and the first semiconductor chip 210. The first semiconductor chip 210 may be electrically connected to the first input wiring line 120 through the first connection terminal 310.

A first underfill layer 215 may be formed in a gap between the film substrate 100 and the first semiconductor chip 210 to fill the gap. The first underfill layer 215 may encapsulate the first connection terminal 310. The first underfill layer 215 may comprise an insulating polymer material, e.g., an epoxy-based polymer.

The second semiconductor chip 220 may be mounted on the first surface 100a of the film substrate 100.

The second semiconductor chip 220 may be spaced apart from the first semiconductor chip 210 in the first direction D1. The second semiconductor chip 220 and the first semiconductor chip 210 may be of the same kind of semiconductor chips. For example, the second semiconductor chip 220 may perform the same function as the first semiconductor chip 210. The second semiconductor chip 220 may have the same size, shape or storage capacity as the first semiconductor chip 210, but is not limited thereto. The second semiconductor chip 220 may have a second height H2. The second height H2 may be substantially equal to the first height H1.

A second output wiring line 130 may be disposed on the first surface 100a of the film substrate 100. As shown in FIG. 3A, the second output wiring line 130 may be spaced apart from the first output wiring line 110. A plurality of second output wiring lines 130 may be provided. The second output wiring lines 130 may be spaced apart from each other and may be electrically separated from each other. Each of the second output wiring lines 130 may have a first end 131 and a second end 132. The first end 131 of each second output wiring line 130 may be adjacent to the first cut line CL1 of the film substrate 100. The second end 132 of each second output wiring line 130 may overlap the second semiconductor chip 220, in a plan view. As shown in FIG. 3D, at least one second connection terminal 320 may be disposed between the second end 132 of the second output wiring line 130 and the second semiconductor chip 220. The second semiconductor chip 220 may be electrically connected to the second output wiring line 130 through the second connection terminal 320. The second connection terminal 320 may include at least one of a pad of solder, a pillar, and a bump. The second connection terminal 320 may include metal.

A second input wiring line 140 may be disposed on the first surface 100a of the film substrate 100. As shown in FIG. 3A, the second input wiring line 140 may be spaced apart from the first input wiring line 120. A plurality of second input wiring lines 140 may be provided. The second input wiring lines 140 may be spaced apart from each other and may be electrically separated from each other. Each of the second input wiring lines 140 may have a first end 141 and a second end 142. The first end 141 of each second input wiring line 140 may be adjacent to the second cut line CL2 of the film substrate 100. The second end 142 of each second input wiring line 140 may overlap the second semiconductor chip 220, in plan view. As shown in FIG. 3D, another second connection terminal 320 may be disposed between the second end 142 of the second input wiring line 140 and the second semiconductor chip 220. The second semiconductor chip 220 may be electrically connected to the second input wiring line 140 through the second connection terminal 320.

A second underfill layer 225 may be formed in a gap between the film substrate 100 and the second semiconductor chip 220 to fill the gap. The second underfill layer 225 may encapsulate the second connection terminal 320. The second underfill layer 225 may comprise an insulating polymer material, e.g., an epoxy-based polymer.

A protection layer 300 may be disposed on each first output wiring line 110, each first input wiring line 120, each second output wiring line 130, and each second input wiring line 140. The protection layer 300 may cover the first and second output wiring lines 110 and 130 and the first and second input wiring lines 120 and 140, thus protecting the first and second output wiring lines 110 and 130 and the first and second input wiring lines 120 and 140. The protection layer 300 may include an insulating material. For example, the protection layer 300 may include a solder resist material.

Figure 4A:
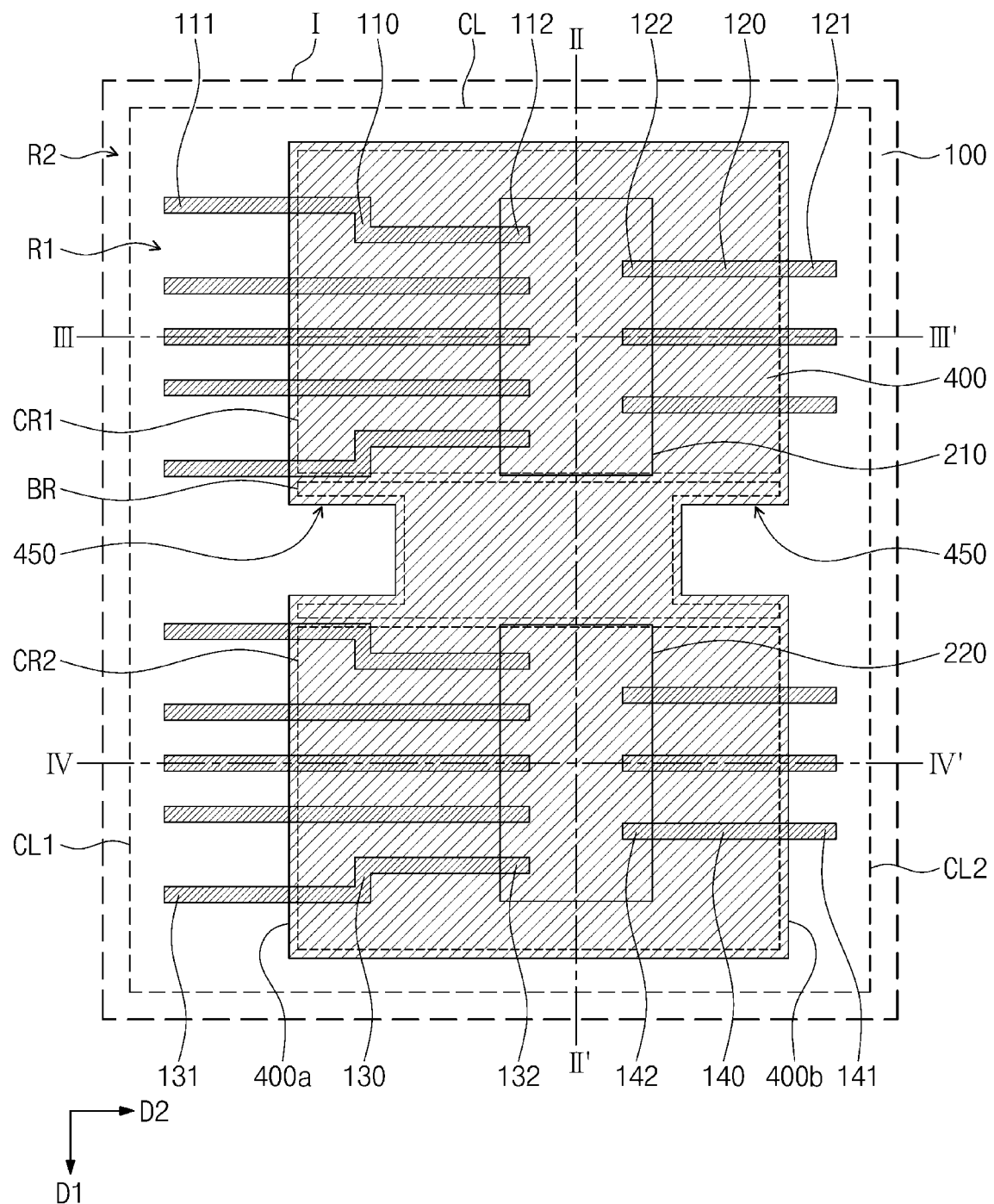
Figure 4B:
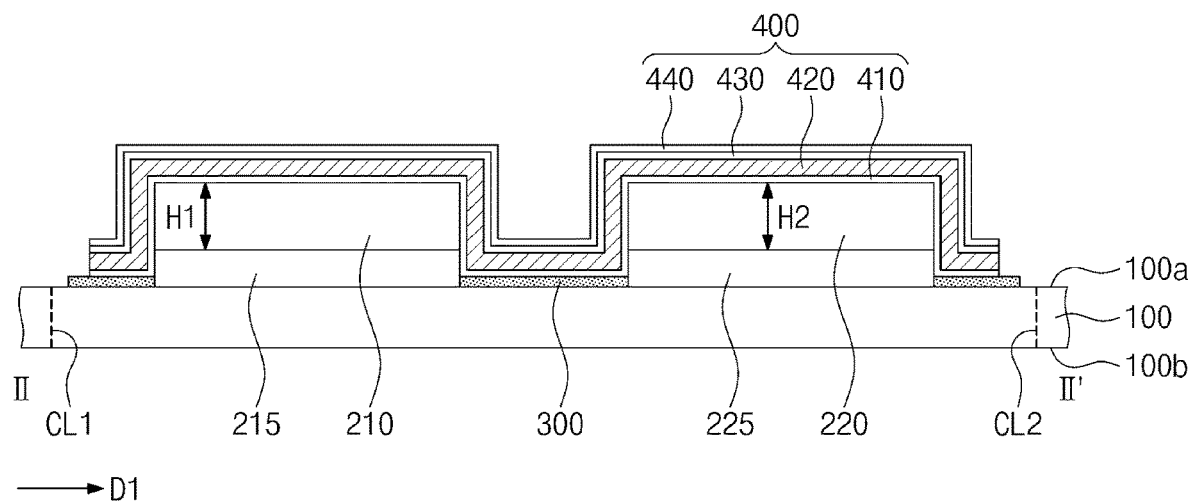
Figure 4C:
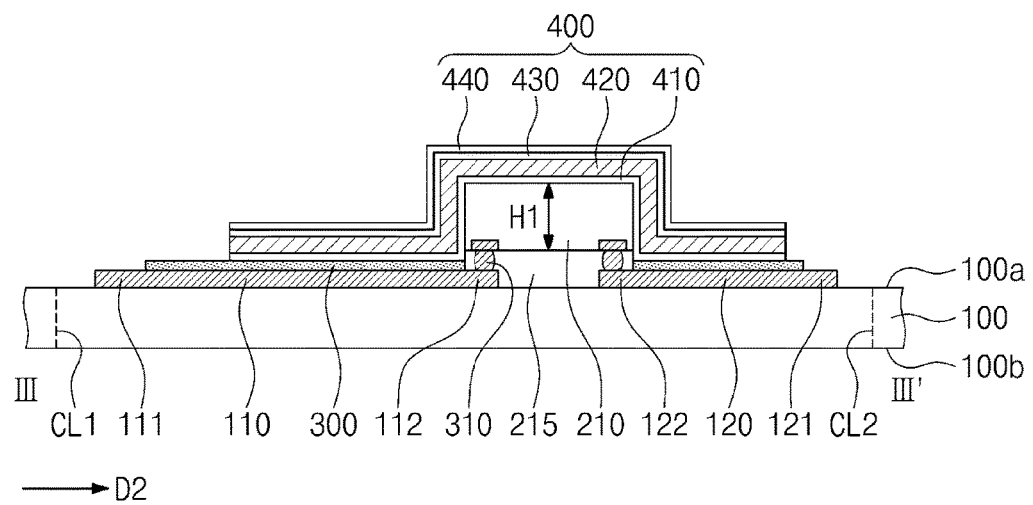
Figure 4D:
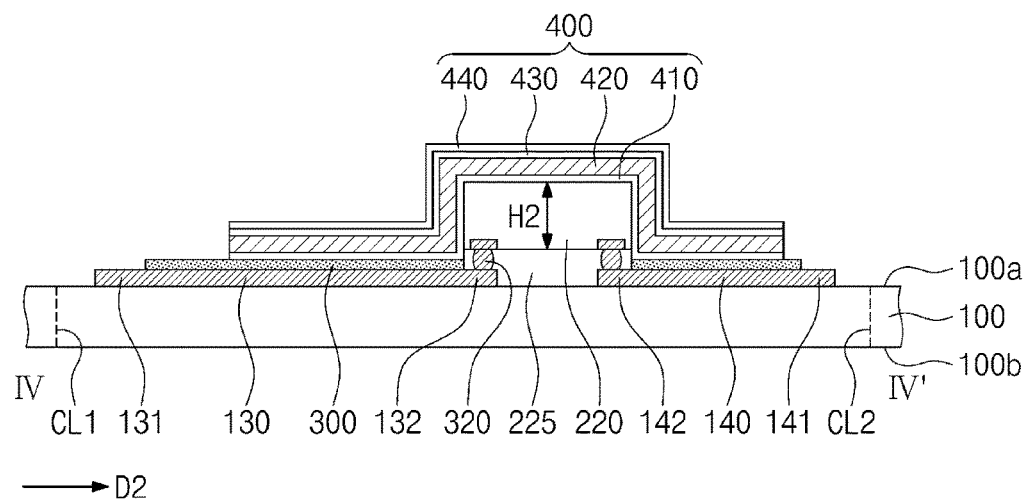
Figure 4E:
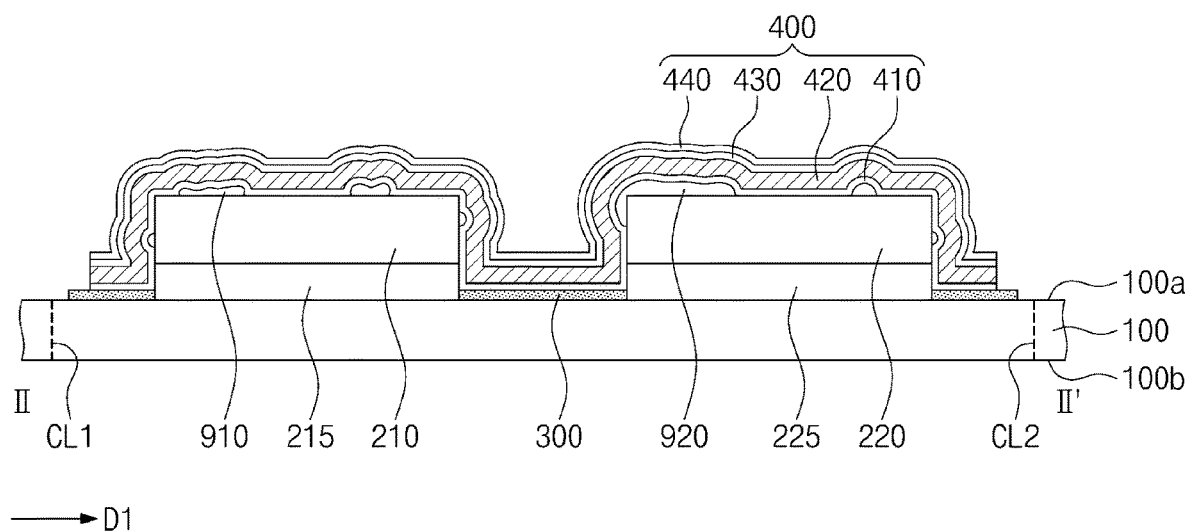
FIG. 4E is a cross-sectional view of a comparative example of a film package.

Referring to FIGS. 1, 4A, 4B, 4C, and 4D, the first film structure 400 may be attached to the film substrate 100 to cover the protection layer 300, the first semiconductor chip 210, and the second semiconductor chip 220. For example, the first film structure 400 described with reference to FIGS. 2A and 2C may be attached to the film substrate 100 and may cover the protection layer 300, the first semiconductor chip 210 and the second semiconductor chip 220. Alternatively, the first film structure 400 of FIG. 2B, the first film structure 400' of FIG. 2D and 2E, or the first film structure 400' of FIG. 2F may be attached to the film substrate 100 and may cover the protection layer 300, the first semiconductor chip 210 and the second semiconductor chip 220. In these cases, the first chip region CR1 and the second chip region CR2 of the first film structure 400 or 400' may overlap the first semiconductor chip 210 and the second semiconductor chip 220, respectively. The bridge region BR may be disposed between the first semiconductor chip 210 and the second semiconductor chip 220, in a plan view. As shown in FIG. 4B, the first film structure 400 may contact the protection layer 300, an upper surface and side surfaces of the first semiconductor chip 210, and an upper surface and side surfaces of the second semiconductor chip 220 and may encapsulate the first semiconductor chip 210 and the second semiconductor chip 220.

FIG. 4E shows a comparative example in which the first film structure 400 does not have the notch 450. In this case, it is difficult to envelop the first semiconductor chip 210 and the second semiconductor chip 220 in the first film structure because of a step between the first surface 100a of the film substrate 100 and the first semiconductor chip 210 and between the first surface 100a of the film substrate 100 and the second semiconductor chip 220. In this case, a first cavity 910 may be formed between the first semiconductor chip 210 and the first film structure 400. For example, the first cavity 910 may be formed between the first semiconductor chip 210 and the first lower adhesive film 410. A second cavity 920 may be formed between the second semiconductor chip 220 and the first lower adhesive film 410. A gas, such as air, may be present in the first cavity 910 and the second cavity 920.

When the first semiconductor chip 210 is operated, heat may be generated from the first semiconductor chip 210. The volume of the gas in the first cavity 910 may be increased by the heat. Thus, the first film structure 400 may be forced away from the first semiconductor chip 210 such that a contact area between the first semiconductor chip 210 and the first film structure 400 may be reduced. It may be difficult for the heat generated from the first semiconductor chip 210 to be transferred to the first film structure 400. Likewise, when the second semiconductor chip 220 is operated, the volume of the gas in the second cavity 920 may be increased by heat generated from the second semiconductor chip 220. Thus, a contact area between the second semiconductor chip 220 and the first film structure 400 may be reduced. The heat from the second semiconductor chip 220 may not be transferred or slowly transferred to the first film structure 400.

Referring again to FIGS. 4A, 4B, 4C, and 4D, according to an aspect of the inventive concept, the first film structure 400 has the notch 450. Thus, the first film structure 400 may efficiently wrap (i.e., blanket while in contact with substantially all of) the first semiconductor chip 210 and the second semiconductor chip 220. The forming of cavities between the first film structure 400 and the first semiconductor chip 210, between the first film structure 400 and the second semiconductor chip 220, and between the first film structure 400 and the protection layer 300 is thus minimized or prevented. In particular, the first film structure 400 may contact the upper surface and the side surfaces of the first semiconductor chip 210 and the upper surface and the side surfaces of the second semiconductor chip 220. When the first semiconductor chip 210 and the second semiconductor chip 220 are continuously operated, the contact area between the first film structure 400 and the first semiconductor chip 210 and between the first film structure 400 and the second semiconductor chip 220 may be sustained. If the first depth D of the notch 450 (refer to FIGS. 2A and 2B) were smaller than the first height H1 of the first semiconductor chip 210 and the second height H2 of the second semiconductor chip 220, the notch 450 may not prevent the forming of the cavities. According to examples of the inventive concept, the first depth D of the notch 450 (refer to FIGS. 2A and 2B) is greater than the first height H1 of the first semiconductor chip 210 and the second height H2 of the second semiconductor chip 220. Thus, the forming of the cavities may be prevented, and the first semiconductor chip 210 and the second semiconductor chip 220 may be efficiently wrapped in or blanketed by the first film structure 400. Even when the film package is operated for a long time, the film package may have a good appearance.

The first conductive film 420 may have a relatively high thermal conductivity (e.g., 200 W/m·K to 100,000 W/mk) as described above. For example, the first conductive film 420 may have a higher thermal conductivity than a semiconductor substrate of the first semiconductor chip 210 and a semiconductor substrate of the second semiconductor chip 220. Thus, the first film structure 400 may function as a heat dissipating film structure. The heat generated from the first semiconductor chip 210 and the second semiconductor chip 220 may be rapidly dissipated to the outside through the first film structure 400 (e.g., the first conductive film 420). Accordingly, an operational characteristic of the film package may be enhanced.

According to examples of the inventive concept, the first conductive film 420 may have such an electrical conductivity that it shields the first and second semiconductor chips 210 and 220, i.e., the first conductive film 420 prevents electromagnetic interference (EMI) from occurring in the first and second semiconductor chips 210 and 220. EMI refers to a phenomenon in which electromagnetic waves radiated or transmitted from an electrical element cause interference in a transmission reception function of another electrical element. The operation of the first and second semiconductor chips 210 and 220 may not interfere with an operation of another device or may not be interrupted by another device.

Figure 5A:
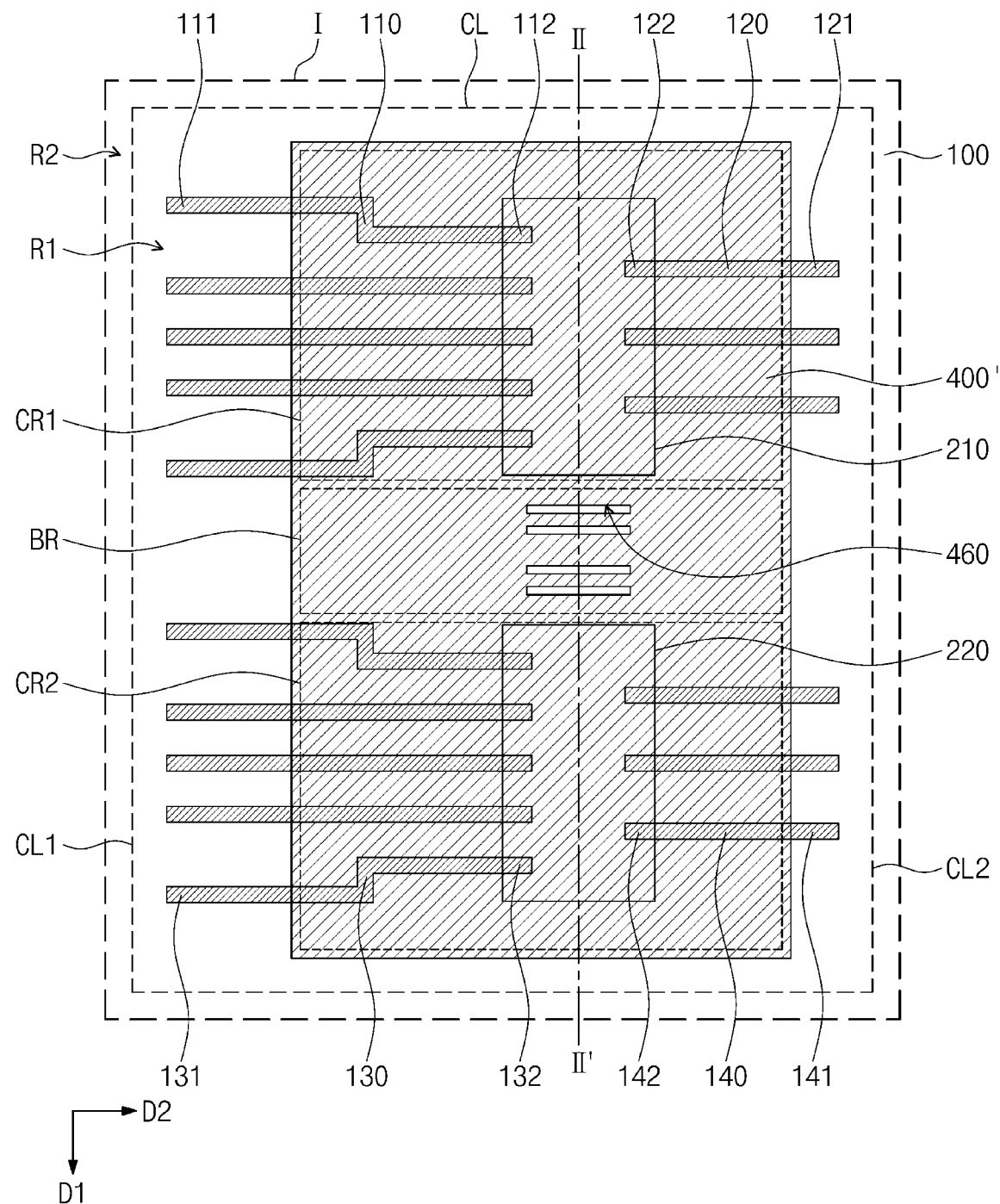
FIG. 5A is a plan view of an example of a film package according to the inventive concept and corresponds to an enlarged view of region I of FIG. 1.
Figure 5B:
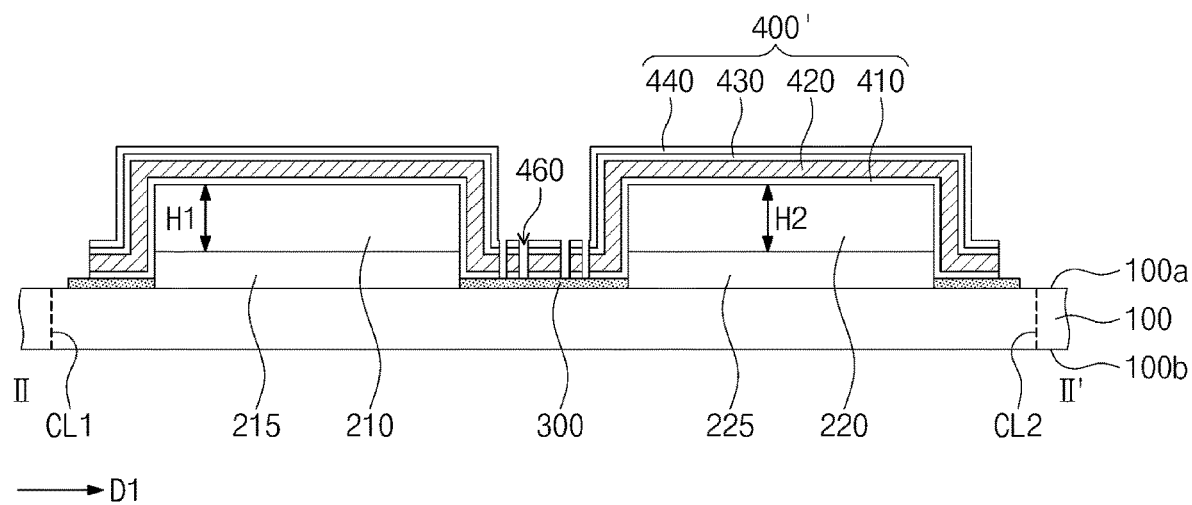
FIG. 5B is a cross-sectional view taken along line II-II' of FIG. 5A.

FIGS. 5A and 5B illustrate another example of a film package according to the inventive concept.

Referring to FIGS. 5A and 5B, the film package according to this example may include the film substrate 100, the first semiconductor chip 210, the second semiconductor chip 220, and the first film structure 400'. The film substrate 100, the first semiconductor chip 210, the second semiconductor chip 220, and the first film structure 400' may be substantially the same as the film substrate 100, the first semiconductor chip 210, the second semiconductor chip 220, and the first film structure 400 described with reference to FIGS. 1, and 3A to 4D.

However, the first film structure 400' includes the slit 460 described with reference to FIGS. 2D and 2F, instead of the notch 450. Alternatively, the slit 460 may have the shape as shown in FIG. 2E. The slit 460 may be disposed between the first semiconductor chip 210 and the second semiconductor chip 220. The slit 460 may expose the protection layer 300. Since the first film structure 400' has the slit 460, the air that is present between the first film structure 400' and the first semiconductor chip 210, between the first film structure 400' and the second semiconductor chip 220, and between the first film structure 400' and the protection layer 300 may be dissipated through the slit 460 in a process of attaching the first film structure 400'. Thus, cavities may not be formed between the first film structure 400' and the first semiconductor chip 210, between the first film structure 400' and the second semiconductor chip 220, and between the first film structure 400' and the protection layer 300.

Figure 6A:
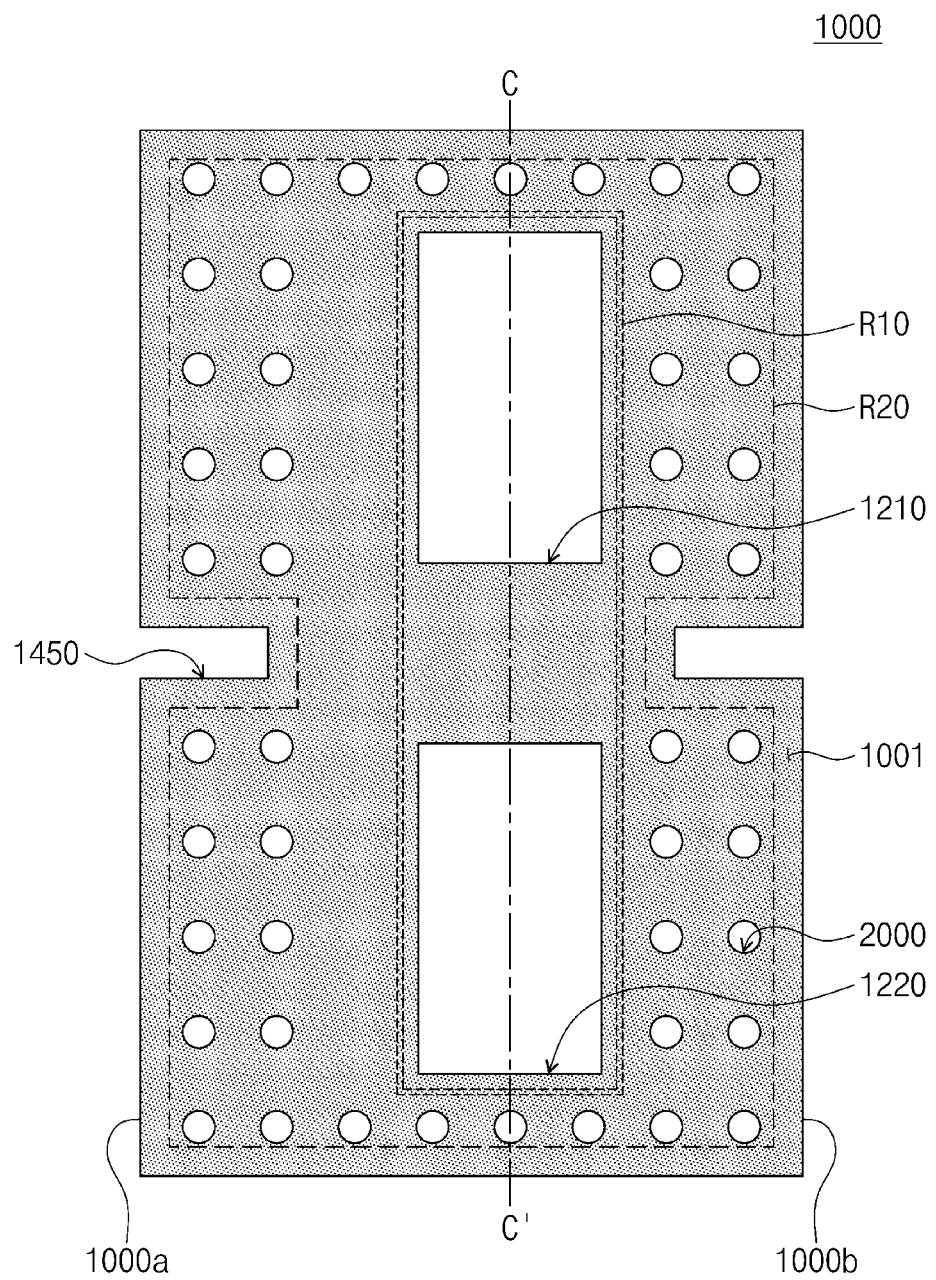
FIG. 6A is a bottom view of an example of an attaching tool used in a method of manufacturing a film package according to the inventive concept.
Figure 6B:
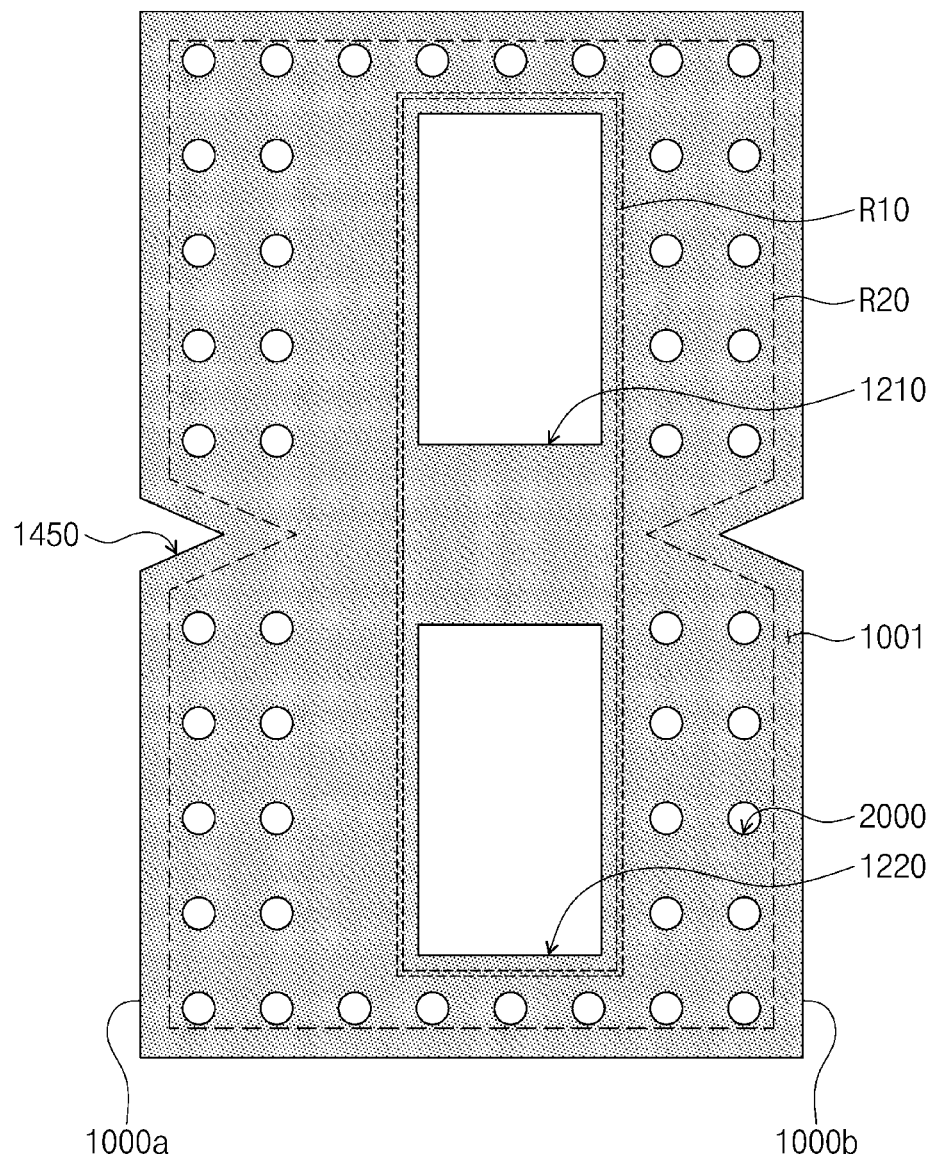
FIG. 6B is a bottom view of an example of an attaching tool used in a method of manufacturing a film package according to the inventive concept.
Figure 6C:
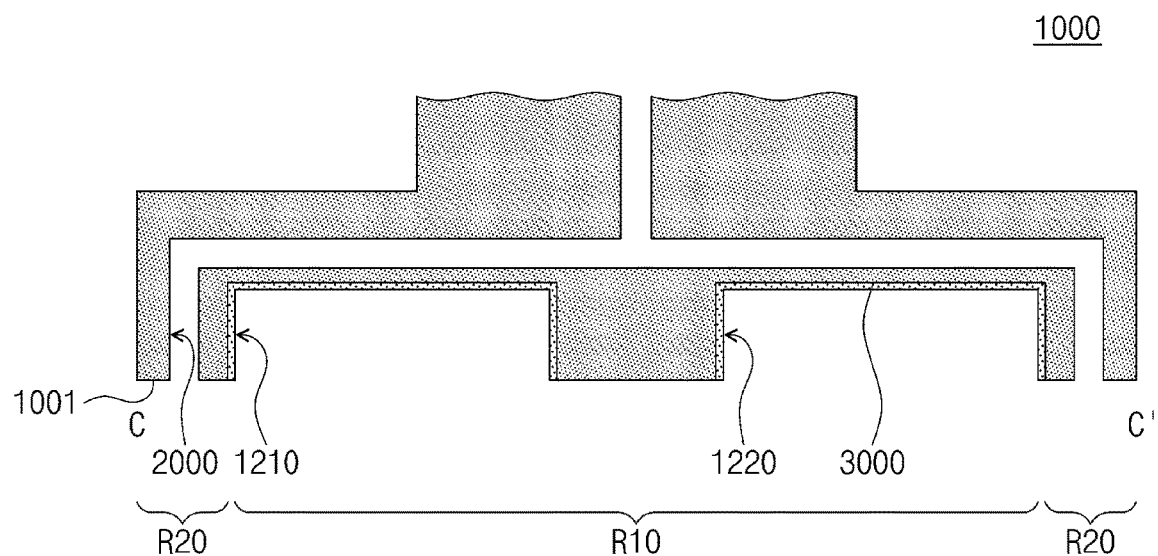
FIG. 6C is a cross-sectional view taken along line C-C' of FIG. 6A.
Figure 6D:
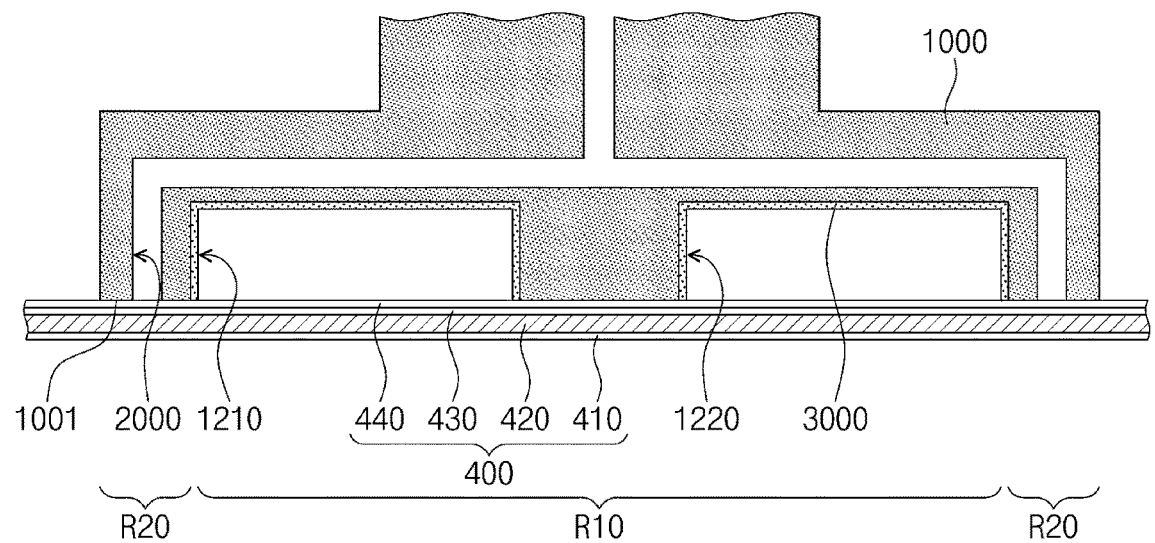
FIG. 6D is a schematic diagram of an attachment step using an attaching tool in a method of manufacturing a film package according to the inventive concept.
Figure 6E:
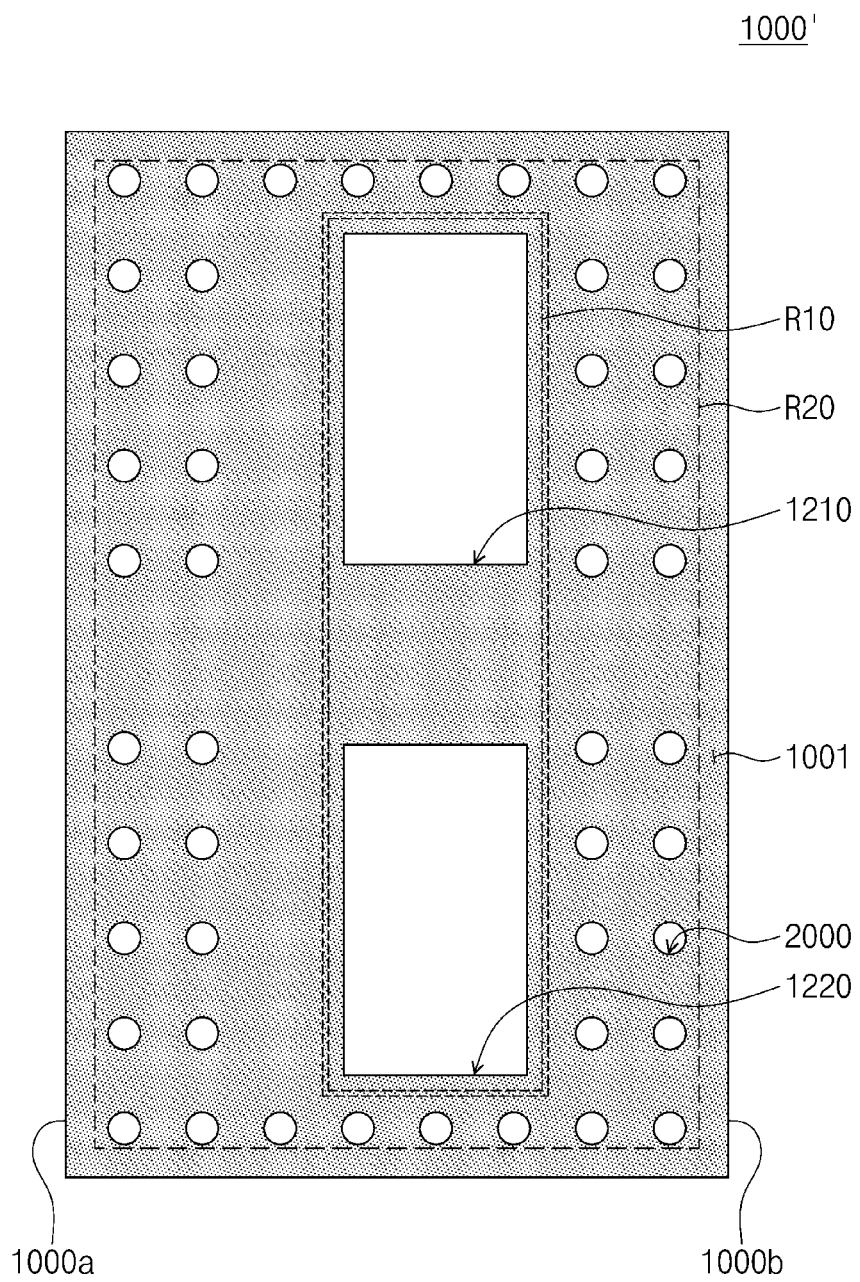
FIG. 6E is a bottom view of an example of an attaching tool used in a method of manufacturing a film package according to the inventive concept.

FIG. 6A illustrates a lower surface of an attaching tool used in a method of fabricating a film package according to the inventive concept. FIG. 6B illustrates a lower surface of another form of the attaching tool. FIG. 6C is a cross-sectional view taken along line C-C' of FIG. 6A. FIG. 6D schematically illustrates the attaching of a film structure using an attaching tool in a method of fabricating a film package according to the inventive concept. FIG. 6E is illustrates a lower surface of still another form of the attaching tool.

Referring to FIGS. 6A, 6B, 6C, 6D, and 6E, an attaching tool 1000 may include a plenum having vacuum holes 2000 therein. As shown in FIG. 6A, a lower surface 1001 of the attaching tool 1000 may include a central region R10 and an edge (peripheral) region R20. The central region R10 may be surrounded by the edge region R20. As an example, the central region R10 may have a rectangular shape. A first groove 1210 and a second groove 1220 may be disposed in the central region R10. The vacuum holes 2000 may not be disposed in the central region. The vacuum holes 2000 may be disposed in the edge region R20 of the lower surface 1001 of the attaching tool 1000. Hereinafter, a step of attaching of the first film structure 400 using the attaching tool 1000 will be described.

As shown in FIG. 6D, the attaching tool 1000 may be lowered such that the edge region R20 of the lower surface 1001 of the attaching tool 1000 contacts an edge region of the first film structure 400. For example, the lower surface 1001 of the attaching tool 1000 may contact the first protective film 440. In the process of attaching the first film structure 400 shown in and described with reference to FIGS. 4A to 4D, the attaching tool 1000 may transport the first film structure 400 while the first film structure 400 is adhered to the tool by a vacuum created in the vacuum holes 2000 by a vacuum device (e.g., a vacuum pump not shown) connected to the vacuum holes 2000. The attaching tool 1000 may be moved to direct the first film structure 400 toward the film substrate 100. The attaching tool 1000 may be provided on the film substrate 100 such that the first groove 1210 and the second groove 1220 are aligned with the first semiconductor chip 210 and the second semiconductor chip 220, respectively. The attaching tool 1000 may press the edge region of the first film structure 400 onto the first surface 100a of the film substrate 100. Thus, the first film structure 400 may be attached to the protection layer 300. Since the first groove 1210 and the second groove 1220 are provided, the first and second semiconductor chips 210 and 220 may not be damaged in the process of attaching the first film structure 400. Buffers 3000 may be provided in the first groove 1210 and the second groove 1220, respectively. The buffers 3000 may each be a spongy material, for example. The buffers 3000 may adsorb a stress applied to the first and second semiconductor chips 210 and 220. The stress may be a physical impact. Because the buffers 3000 are provided in the first groove 1210 and the second groove 1220, the first and second semiconductor chips 210 and 220 may be prevented from being damaged. Hereinafter, a shape of the lower surface 1001 of the attaching tool 1000 will be described in more detail.

Referring to FIGS. 6A and 6B, the lower surface 1001 of the attaching tool 1000 may have a shape corresponding to a planar surface of the first film structure 400. A notch portion 1450 may be disposed in the edge region R20 of the lower surface 1001 of the attaching tool 1000. The notch portion 1450 may be disposed in at least one of a first side 1000a and a second side 1000b of the attaching tool 1000. The first side 1000a of the attaching tool 1000 may be opposite to the second side 1000b thereof. The attaching tool 1000 may be used to attach the first film structure 400 having the notch 450. In this case, the notch portion 1450 may have a shape, a planar arrangement, a size, or number of sections corresponding to that of the notch 450 of the first film structure 400. Referring to FIG. 6A, the attaching tool 1000 may have a rectangular notch portion 1450. In this case, the attaching tool 1000 may be used to attach the first film structure 400 having the notch 450 shown in and described with reference to FIG. 2A. Referring to FIG. 6B, the attaching tool 1000 may have a triangular notch portion 1450. In this case, the attaching tool 1000 may be used to attach the first film structure 400 having the notch 450 shown in and described with reference to FIG. 2B. In the process of attaching the first film structure 400, if the vacuum holes 2000 were provided at a location corresponding to that of the notch 450 of the first film structure 400, it could be difficult for the attaching tool 1000 to vacuum-adsorb the first film structure 400. On the other hand, according to the inventive concept, in the process of attaching the first film structure 400, the notch portion 1450 of the attaching tool 1000 is provided at a location corresponding to that of the notch 450 of the first film structure 400. The vacuum holes 2000 are not be provided at the location corresponding to that of the notch 450 of the first film structure 400. The attaching tool 1000 may efficiently vacuum-adsorb the first film structure 400.

FIG. 6E shows an attaching tool 1000' that may be used to attach the first film structures 400 having the slits 460 shown in described with reference to FIGS. 2D to 2F.

Figure 7:
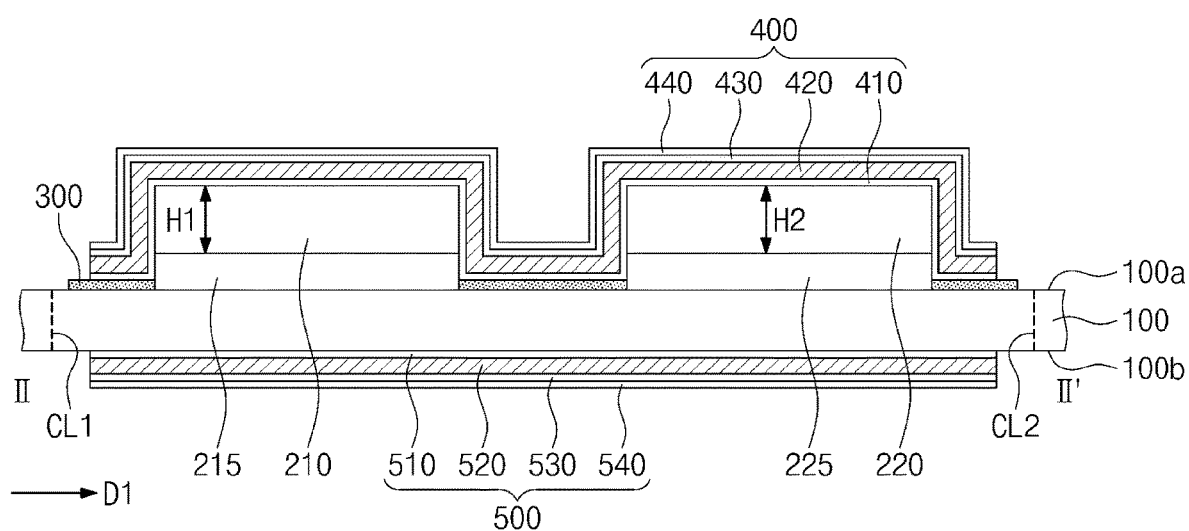
FIG. 7 is a cross-sectional view of an example of a film package according to the inventive concept.

FIG. 7 illustrates still another example of a film package according to the inventive concept and corresponds to a cross-sectional view taken along line II-II' of FIG. 4A.

Referring to FIGS. 1, 4A, and 7, a film package according to the inventive concept may include the film substrate 100, the first semiconductor chip 210, the second semiconductor chip 220, the first film structure 400, and a second film structure 500.

The second film structure 500 may be disposed on the second surface 100b of the film substrate 100. The second film structure 500 may overlap the first semiconductor chip 210 and the second semiconductor chip 220, in a plan view. The second film structure 500 may include a second lower adhesive film 510, a second conductive film 520, a second upper adhesive film 530, and a second protective film 540. The second lower adhesive film 510 may comprise an insulating polymer material similar to that of the first lower adhesive film 410. The second conductive film 520 may be attached to the film substrate 100 by the second lower adhesive film 510. The second conductive film 520 may include metal or a carbon-containing material. The second conductive film 520 may have a relatively high thermal conductivity (e.g., 200 W/m·K to 100,000 W/mk). Because the second film structure 500 includes the second conductive film 520, the second film structure 500 may function as a thermal dissipation film structure. For example, when the first and second semiconductor chips 210 and 220 are operated, the heat generated from the first and second semiconductor chips 210 and 220 may be rapidly dissipated to the outside through the second conductive film 520. Thus, an operational characteristic of the film package may be enhanced. The second conductive film 520 may have an electrical conductivity. Thus, the first and second semiconductor chips 210 and 220 may be shielded by the second conductive film 520 from electromagnetic interference (EMI).

The second upper adhesive film 530 may be disposed on the second conductive film 520 to cover the second conductive film 520. The second upper adhesive film 530 may comprise an insulating polymer material similar to that of the first upper adhesive film 430.

The second protective film 540 may be disposed on the second upper adhesive film 530. The second protective film 540 may be attached to the second conductive film 520 by the second upper adhesive film 530. The second protective film 540 may prevent the second conductive film 520 from being damaged (e.g., oxidized or corroded) by an external impurity.

The film substrate 100, the first semiconductor chip 210, the second semiconductor chip 220, and the first film structure 400 may be substantially the same as those shown in and described with reference to FIGS. 1 to 4D. The first film structure 400 may have the same shape as that shown in and described with reference to FIG. 2A. Alternatively, the first film structure 400 of FIG. 2B, the first film structure 400' of FIGS. 2D and 2F, or the first film structure 400' of FIG. 2E may be used in the film package.

Figure 8A:
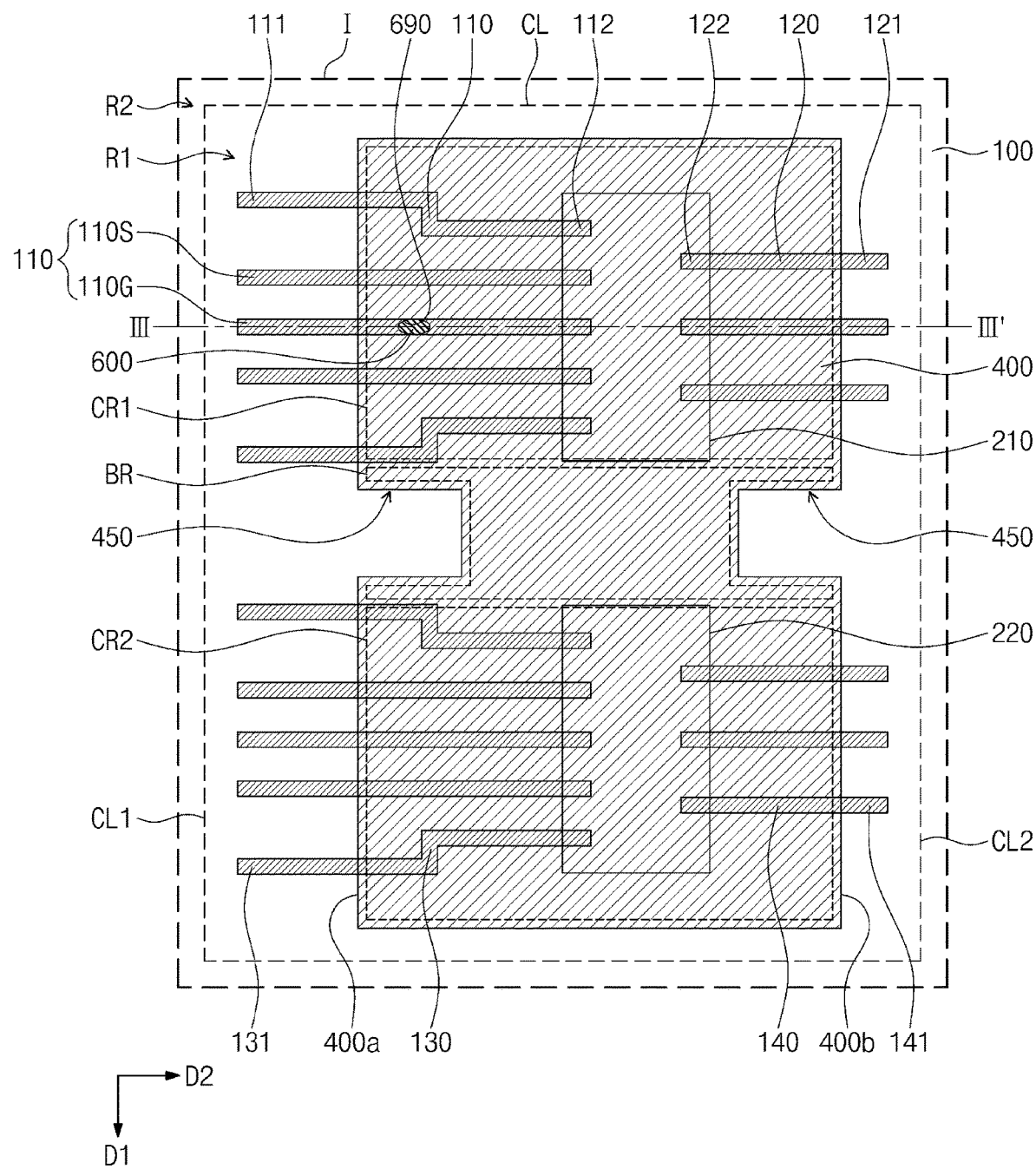
FIG. 8A is a plan view of an example of a film package according to the inventive concept and corresponds to an enlarged view of region I of FIG. 1.
Figure 8B:
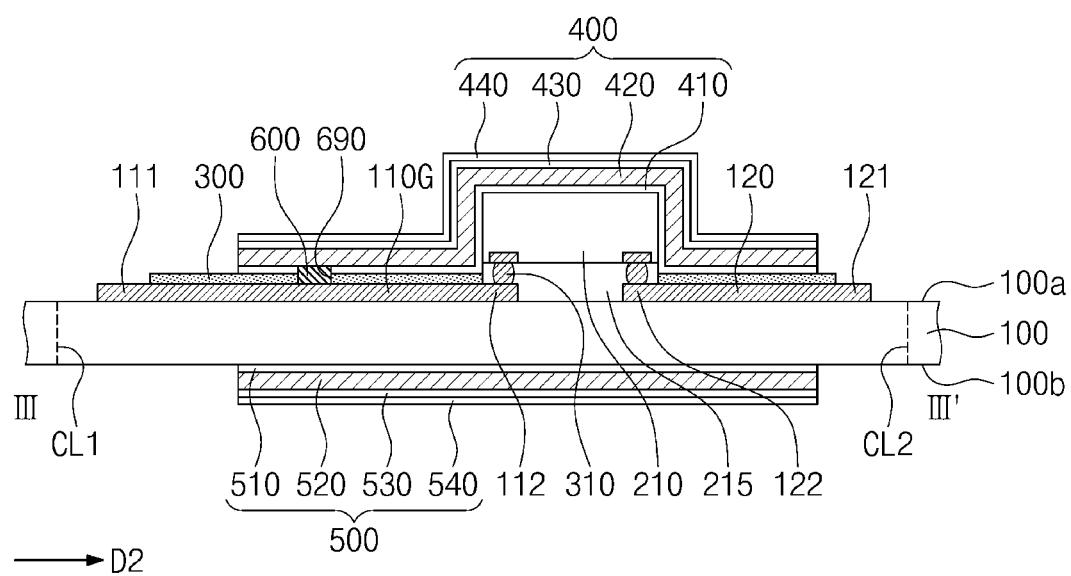
FIG. 8B is a cross-sectional view taken along line of FIG. 8A.

FIGS. 8A and 8B illustrate another example of a film package according to the inventive concept.

Referring to FIGS. 1, 4B, 4D, 8A, and 8B, a film package according to the inventive concept may include the film substrate 100, the first semiconductor chip 210, the second semiconductor chip 220, the first film structure 400, the second film structure 500, the first output wiring line 110, the first input wiring line 120, the second output wiring line 130, and the second input wiring line 140. The film substrate 100, the first semiconductor chip 210, the second semiconductor chip 220, the first film structure 400, the second film structure 500, the first output wiring line 110, the first input wiring line 120, the second output wiring line 130, and the second input wiring line 140 may be similar to those described above.

A plurality of first output wiring lines 110 may be provided. The first output wiring lines 110 may include a ground wiring line 110G and a signal wiring line 110S. A hole 690 may extend through the first lower adhesive film 410 and the protection layer 300. The hole 690 may expose the ground wiring line 110G. A ground part (or simply "ground") 600 may be disposed in the hole 690. The ground part 600 may be a body of conductive material, e.g., a body of metal. The first conductive film 420 may be electrically connected to the ground wiring line 110G through the ground part 600. The first conductive film 420 may include an electrically conductive material. Charges may accumulate in the first conductive film 420 for various reasons. When more than a predetermined amount of charges have accumulated in the first conductive film 420, the charges can electrostatically discharge from the first conductive film 420 to other electrically conductive elements (e.g., integrated circuits and internal wiring lines), potentially damaging the other electrically conductive elements. According to this example of the inventive concept, however, the first conductive film 420 is electrically connected to the ground wiring line 110G such that the film package may be prevented from being damaged by the electrostatic discharge (ESD). Accordingly, the reliability of the film package may be enhanced. In some examples, the ground part 600 is omitted and the first conductive film 420 extends into the hole 690. In this case, the first conductive film 420 may be electrically connected to the ground wiring line 110G.

In some examples, one of the first input wiring line 120, the second output wiring line 130, and the second input wiring line 140 includes a ground wiring line. In this case, the first conductive film 420 may be connected to the ground wiring line.

Also, this example of the film package may employ the first film structure 400 of FIG. 2C, the first film structure 400' of FIGS. 2D and 2F, or the first film structure 400' of FIG. 2E instead of the first film structure 400 of FIGS. 2A and 2B.

Figure 9A:
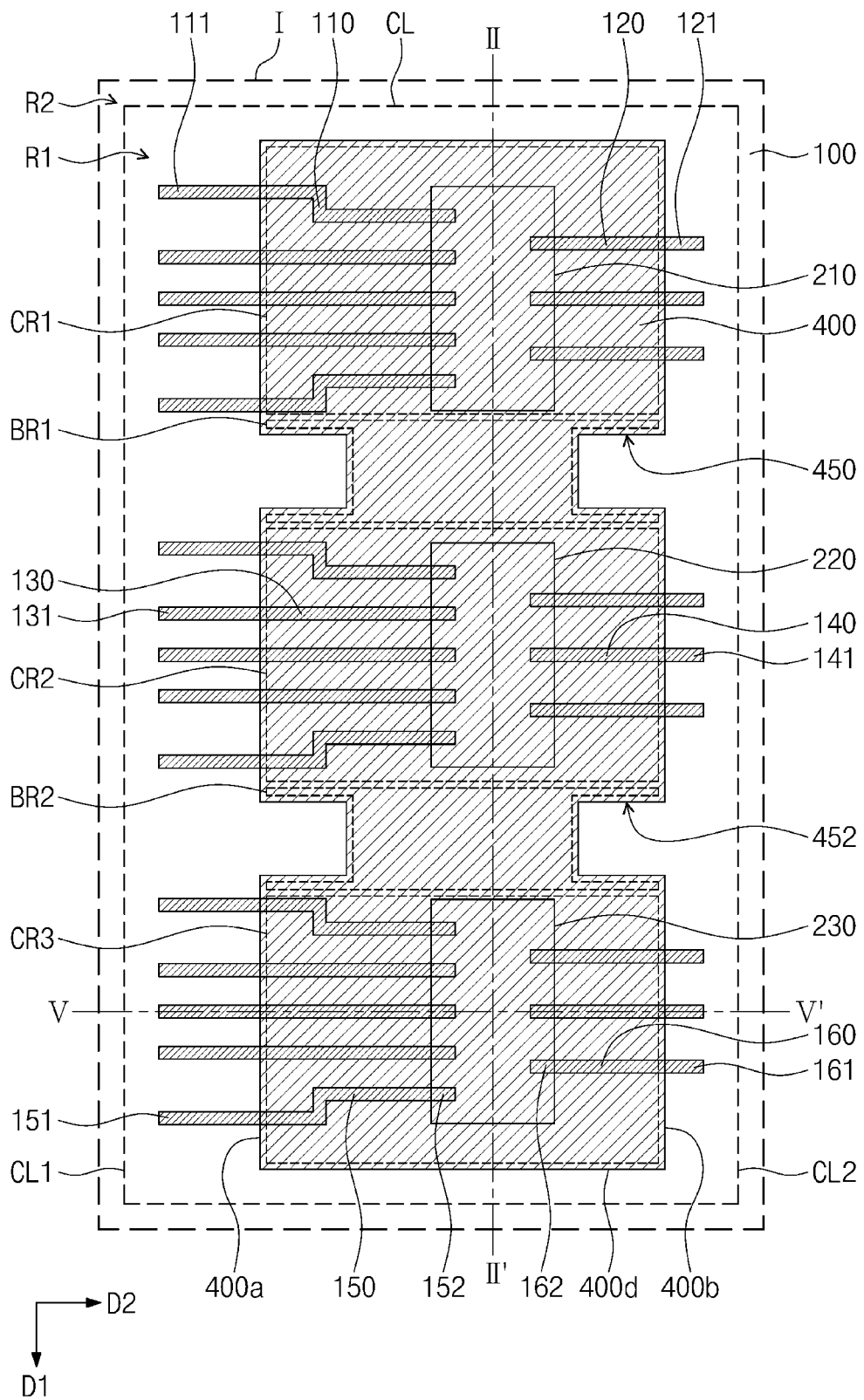
FIG. 9A is a plan view of an example of a film package according to the inventive concept and corresponds to an enlarged view of region I of FIG. 1.
Figure 9B:
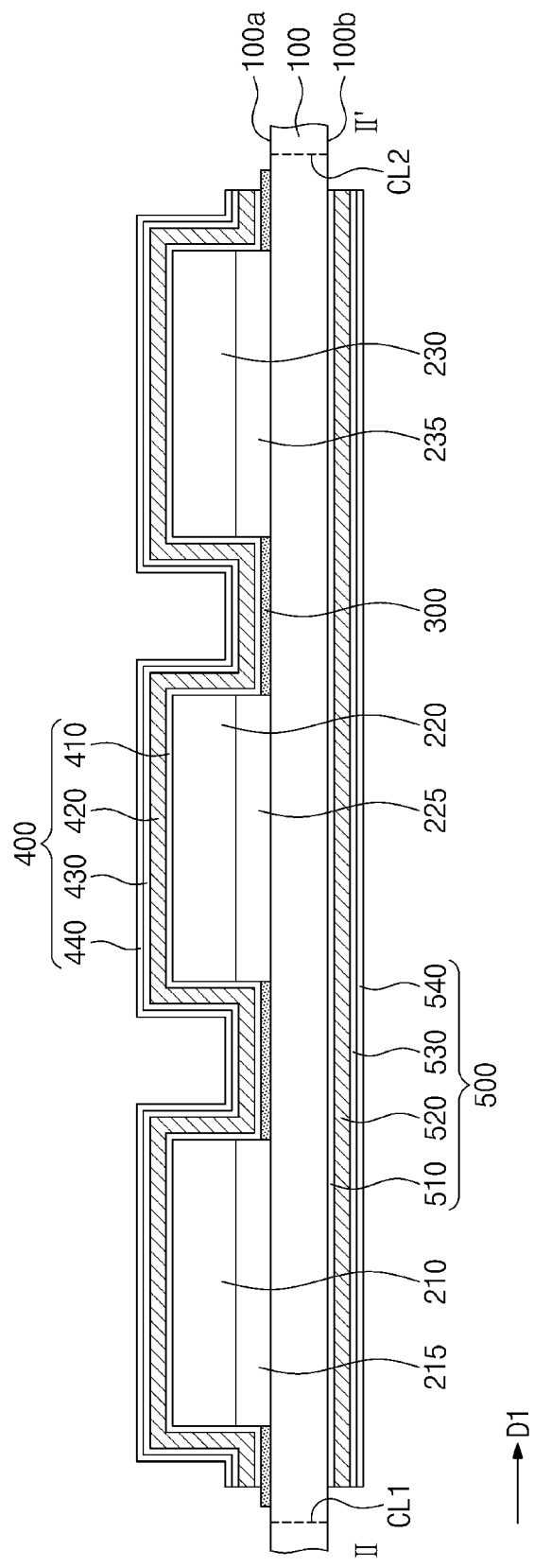
FIG. 9B is a cross-sectional view taken along line II'-II' of FIG. 9A.
Figure 9C:
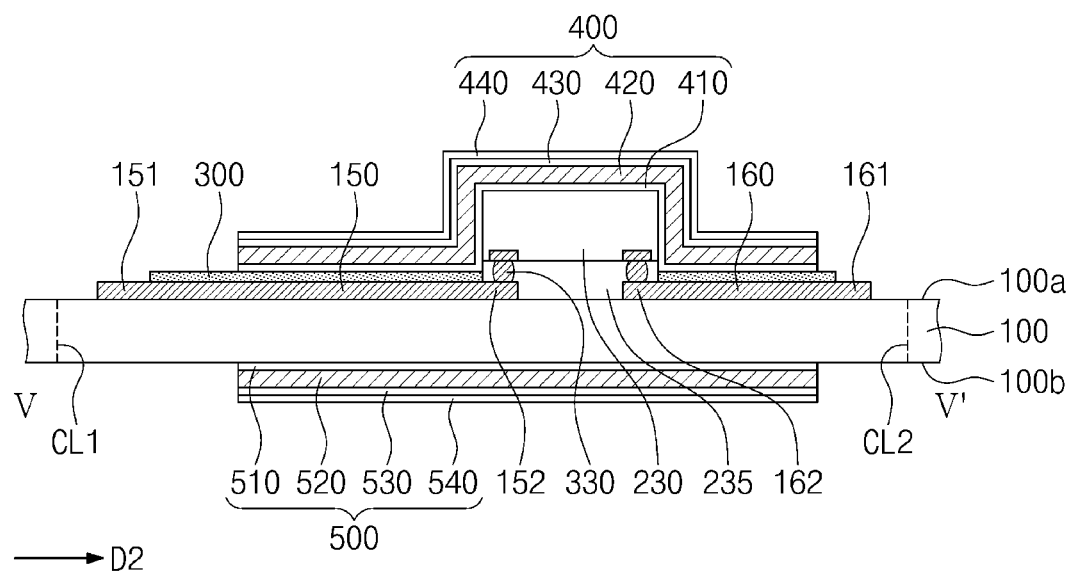
FIG. 9C is a cross-sectional view taken along line V-V' of FIG. 9A.

FIGS. 9A-9C illustrate another example of a film package according to the inventive concept.

Referring to FIGS. 9A, 9B, and 9C, a film package according to the inventive concept may include the film substrate 100, the first semiconductor chip 210, the second semiconductor chip 220, the first film structure 400, the second film structure 500, and a third semiconductor chip 230. The film substrate 100, the first semiconductor chip 210, the second semiconductor chip 220, the first film structure 400, and the second film structure 500 may be similar to those described above.

The third semiconductor chip 230 may be disposed on the first surface 100a of the first region R1 of the film substrate 100. The third semiconductor chip 230 may be spaced apart from the second semiconductor chip 220 in the first direction D1. A third output wiring line 150 may be disposed on the first surface 100a of the film substrate 100. A first end 151 of the third output wiring line 150 may be adjacent to the first cut line CL1 of the film substrate 100. The first end 151 of the third output wiring line 150 may be exposed by the protection layer 300. A second end 152 of the third output wiring line 150 may overlap the third semiconductor chip 230 in plan view. As shown in FIG. 9C, at least one third connection terminal 330 may be disposed between the second end 152 of the third output wiring line 150 and the third semiconductor chip 230. The third connection terminal 330 may include at least one of a pad of solder, a pillar, and a bump. The third connection terminal 330 may comprise metal. The third semiconductor chip 230 may be electrically connected to the third output wiring line 150 through the third connection terminal 330.

A third input wiring line 160 may be disposed on the first surface 100a of the film substrate 100. A first end 161 of the third input wiring line 160 may be adjacent to the second cut line CL2 of the film substrate 100. The first end 161 of the third input wiring line 160 may be exposed by the protection layer 300. A second end 162 of the third input wiring line 160 may overlap the third semiconductor chip 230, in a plan view. Another third connection terminal 330 may be disposed between the second end 162 of the third input wiring line 160 and the third semiconductor chip 230. The third semiconductor chip 230 may be electrically connected to the third input wiring line 160 through the third connection terminal 330. The protection layer 300 may expose the first end 151 of the third output wiring line 150 and the first end 161 of the third input wiring line 160.

The first film structure 400 may cover the first semiconductor chip 210, the second semiconductor chip 220, and the third semiconductor chip 230. The first film structure 400 may include the first chip region CR1, the second chip region CR2, a third chip region CR3, a first bridge region BR1, and a second bridge region BR2. The third chip region CR3 may be closer than the second chip region CR2 to the fourth side 400d of the film substrate 100. The third chip region CR3 may overlap the third semiconductor chip 230, in a plan view.

The first bridge BR1 may be substantially the same as the bridge region BR described above. For example, the first bridge region BR1 may be disposed between the first semiconductor chip 210 and the second semiconductor chip 220 and extend between the first side 400a of the first film structure 400 and the second side 400b of the first film structure 400.

The second bridge BR2 may be disposed between the second chip region CR2 and the third chip region CR3. For example, the second bridge BR2 may be disposed between the second semiconductor chip 220 and the third semiconductor chip 230 and extend between the first side 400a of the first film structure 400 and the second side 400b of the first film structure 400.

A first notch 450 may be disposed in the first bridge region BR1 of the first film structure 400. For example, the first notch 450 may be disposed in at least one of the first and second sides 400a and 400b of the first film structure 400. The first notch 450 may be a rectangular notch. Alternatively, the first notch 450 may be a triangular notch. The number or shape of the first notch 450 may differ from that shown in FIGS. 9A-9C.

A second notch 452 may be disposed in the second bridge region BR2 of the first film structure 400. For example, the second notch 452 may be disposed in at least one of the first and second sides 400a and 400b of the first film structure 400. The second notch 452 may be a rectangular notch. However, the shape of the second notch 452 may be other than rectangular as described above. By virtue of the second notch 452, the first film structure 400 may efficiently wrap the second semiconductor chip 220 and the third semiconductor chip 230. Thus, cavities may not be formed between the second semiconductor chip 220 and the first film structure 400 and between the third semiconductor chip 230 and the first film structure 400.

In some examples, a slit 460 (of a type shown in and described with reference to 2D to 2F) is disposed in the first bridge region BR1 of the first film structure 400 instead of a notch 450. In some examples, a slit 460 (again, refer to 2D to 2F) is disposed in the second bridge region BR2 of the first film structure 400 instead of a notch 450.

The first film structure 400 may expose the first end 151 of the third output wiring line 150 and the first end 161 of the third input wiring line 160.

Although not shown in the drawings, at least one of the first to third output wiring lines 110, 130, and 150 and the first to third input wiring lines 120, 140, and 160 may include a ground wiring line. The ground part 600 described with reference to FIGS. 8A and 8B may be disposed in the protection layer 300 and the first protective film 440 to be connected to the ground wiring line. In some examples, the second film structure 500 is omitted.

Figure 10A:
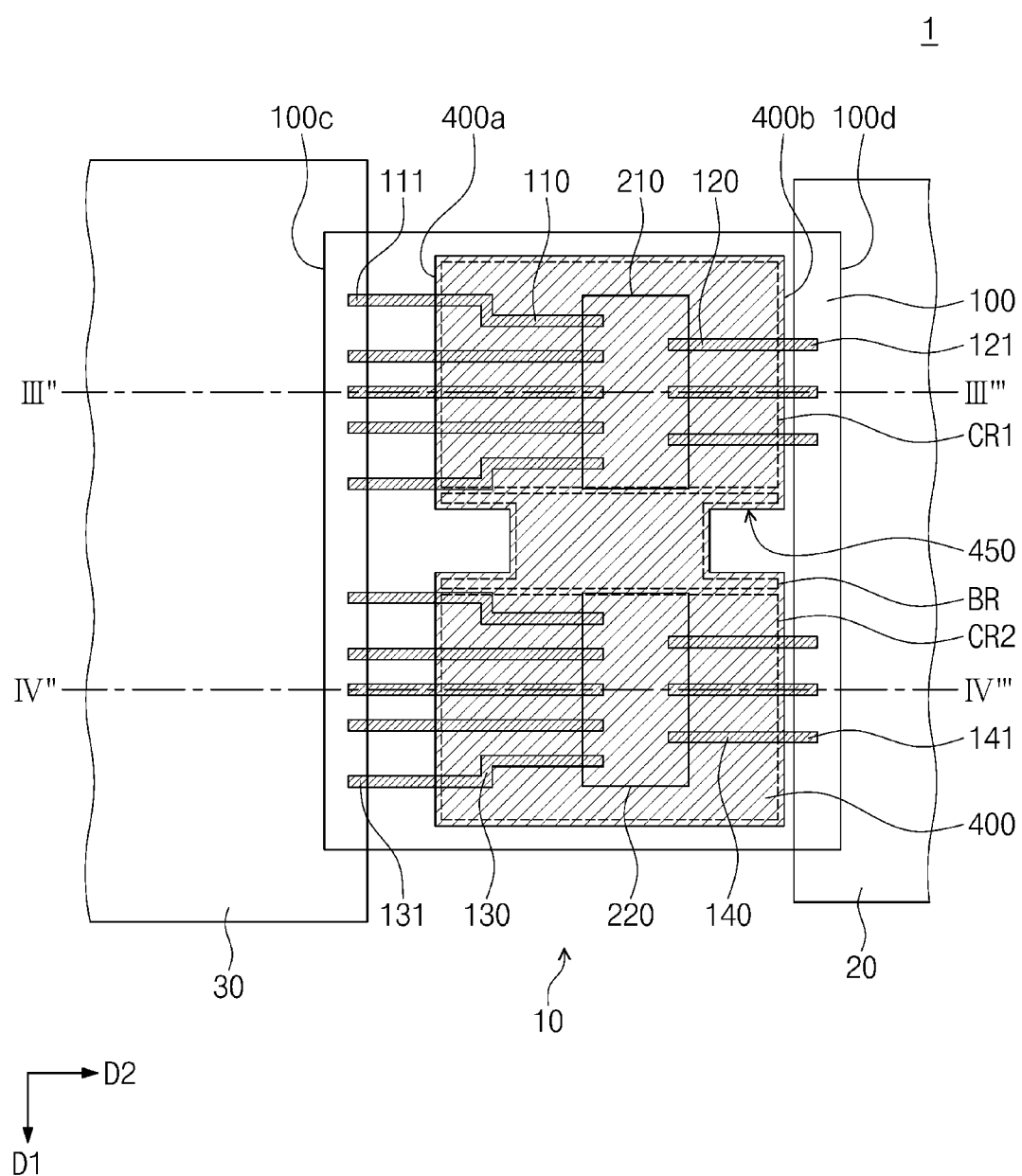
FIG. 10A is a plan view of an example of a package module according to the inventive concept.
Figure 10B:
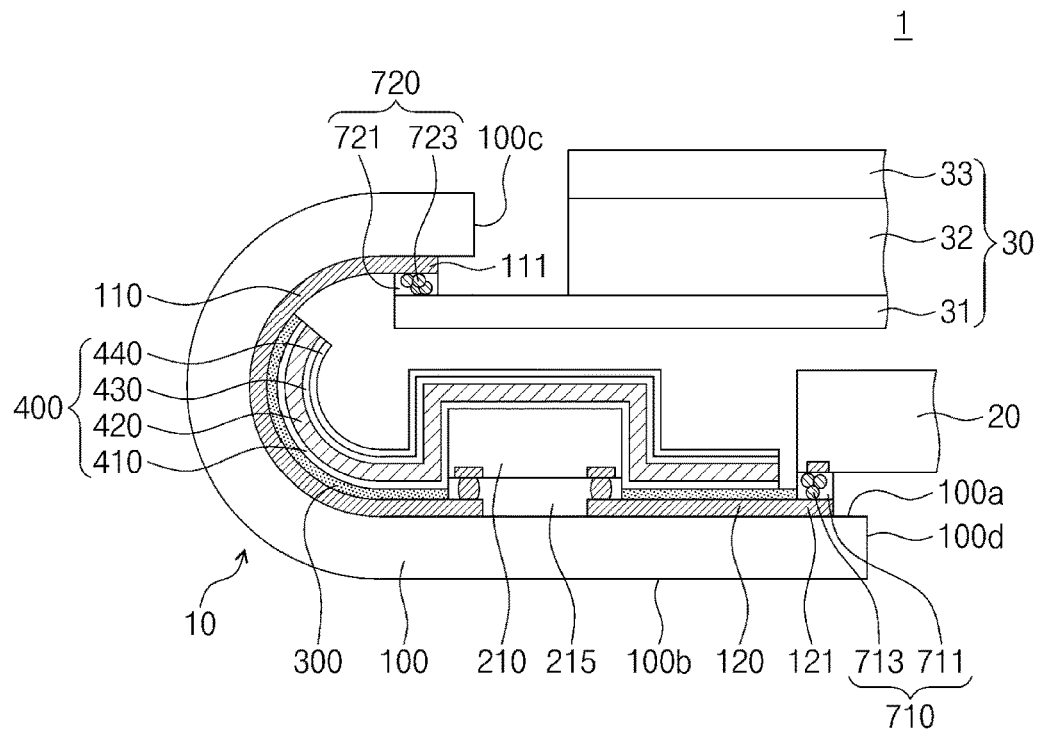
FIG. 10B is a cross-sectional view taken along line III"-III'" of FIG. 10A.
Figure 10C:
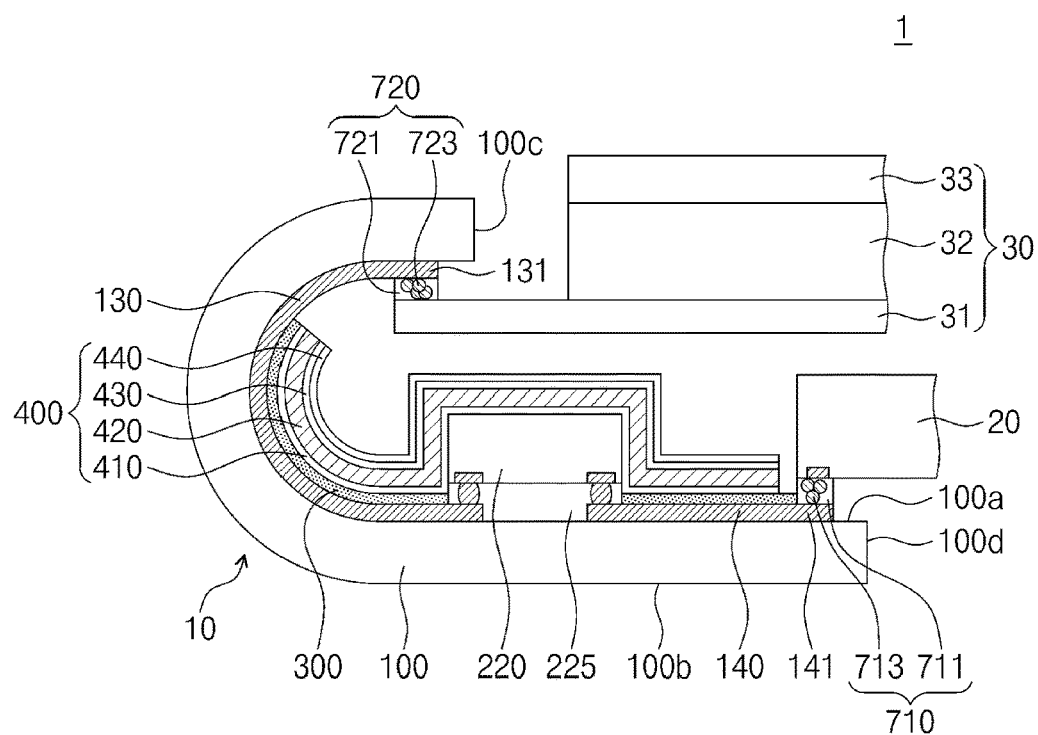
FIG. 10C is a cross-sectional view taken along line IV"-IV'" of FIG. 10A.

FIGS. 10A-10C illustrate an example of a package module according to the inventive concept.

Referring to FIGS. 10A-10C, a package module 1 may include a unit film package 10, a circuit substrate 20, and a display device 30. The package module 1 may be a display device assembly. The package module 1 may employ a film package (FPKG) described above with reference to FIGS. 1 and 4A to 4D. Referring again to FIG. 1, the film package (FPKG) may be cut along the cut line CL, such that a plurality of unit film packages 10 may be separated from each other. The unit film packages 10 may include the first regions R1 of the film substrate 100 and the elements on the first regions RE For example, each of the unit film packages 10 includes the film substrate 100, the first semiconductor chip 210, the second semiconductor chip 220, and the first film structure 400. In each unit film package 10, one side 100c and another side 100d of the film substrate 100 may correspond to the first cut line CL1 and the second cut line CL2, respectively, of the film substrate 100 before being cut. Alternatively, the film package described with reference to FIGS. 5A and 5B, the film package described with reference to FIG. 7, the film package described with reference to FIGS. 8A and 8B, or the film package described with reference to FIGS. 9A to 9C may be employed by the package module 1.

The circuit substrate 20 and the display device 30 may be attached to the first surface 100a of the film substrate 100 to manufacture the package module 1. As shown in FIGS. 10B and 10C, the film substrate 100 may be flexible to be bent. For example, a portion of the first surface 100a of the film substrate 100 may face another portion of the first surface 100a of the film substrate 100.

The circuit substrate 20 may be disposed on the first surface 100a. The circuit substrate 20 may be adjacent to the side 100d of the film substrate 100. For example, the circuit substrate 20 may include a printed circuit board (PCB) or a flexible printed circuit board (FPCB). The protection layer 300 and the first film structure 400 may expose the first end 121 of the first input wiring line 120 and the first end 141 of the second input wiring line 140. An input connection part 710 may be disposed between the first end 121 of the first input wiring line 120 and the circuit substrate 20 and between the first end 141 of the second input wiring line 140 and the circuit substrate 20. The input connection part 710 may include an anisotropic conductive film (ACF). For example, the input connection part 710 may include a first adhesive polymer 711 and first metal particles 713 in the first adhesive polymer 711. As shown in FIG. 10B, the circuit substrate 20 may be electrically connected to the first input wiring line 120 by the first metal particles 713. The circuit substrate 20 may be electrically connected to the first semiconductor chip 210 through the first input wiring line 120. As shown in FIG. 10C, the circuit substrate 20 may be electrically connected to the second input wiring line 140 through the first metal particles 713. The circuit substrate 20 may be electrically connected to the second semiconductor chip 220 through the second input wiring line 140. The second input wiring line 140 may be electrically separated from the first input wiring line 120.

The display device 30 may be disposed on the first surface 100a of the film substrate 100. The display device 30 may be adjacent to the one side 100c of the film substrate 100. The display device 30 may include a display substrate 31, a display panel 32, and a protection part 33 that are stacked one on another. An output connection part 720 may be disposed between the display substrate 31 and the first end 111 of the first output wiring line 110 and between the display substrate 31 and the first end 131 of the second output wiring line 130. The output connection part 720 may include an anisotropic conductive film. For example, the output connection part 720 may include a second adhesive polymer 721 and second metal particles 723 in the second adhesive polymer 721. As shown in FIG. 10B, the display substrate 31 may be electrically connected to the first semiconductor chip 210 through the second metal particles 723 and the first output wiring line 110. As shown in FIG. 10C, the display substrate 31 may be electrically connected to the second output wiring line 130 through the second metal particles 723. The display device 30 may be electrically connected to the second semiconductor chip 220 through the second output wiring line 130.

The first semiconductor chip 210 may receive signals from the circuit substrate 20 through the first input wiring line 120. The first semiconductor chip 210 may include driving integrated circuits (e.g., a gate driving integrated circuit and/or a data driving integrated circuit) and may generate driving signals (e.g., a gate driving signal and/or a data driving signal). The driving signals generated from the first semiconductor chip 210 may be supplied to a gate line and/or a data line of the display substrate 31 to operate the display panel 32. Likewise, the second semiconductor chip 220 may receive signals from the circuit substrate 20 through the second input wiring line 140. The second semiconductor chip 220 may include driving integrated circuits and may generate driving signals. The driving signals generated from second semiconductor chip 220 may be supplied to the gate line and/or the data line of the display substrate 31 through the second output wiring line 130 thereby operating the display panel 32. According to the inventive concept, because the plurality of semiconductor chips 210 and 220 are provided, an operating speed and performance of the package module 1 may be enhanced. Thus, a high speed and high resolution of the display device 30 may be realized.

A driving voltage of the package module 1 may be relatively high. According to the inventive concept, the first film structure 400 may include at least one notch 450 or at least one slit 460 (refer to FIGS. 2D to 2E). Even though the package module 1 is operated for a long time, the first film structure 400 may be fixedly attached to the first semiconductor chip 210 and the second semiconductor chip 220. Thus, the heat generated from the first semiconductor chip 210 and the second semiconductor chip 220 may be easily dissipated.

Although the present inventive concept has been particularly shown and described with reference to examples thereof, it will be understood by those of ordinary skill in the art that various changes in form and details may be made to such examples without departing from the spirit and scope of the present inventive concept as defined by the following claims.

What is claimed is:
1. A chip on film (COF) package comprising:
a film substrate having a first surface and a second surface opposite to each other in a thickness direction of the film substrate, the first surface comprising:
  a first chip region;
  a second chip region; and
  a bridge region provided between the first and second chip regions;
a first semiconductor chip provided on the first chip region of the first surface of the film substrate and having a first height in the thickness direction;
a second semiconductor chip provided on the second chip region of the first surface of the film substrate, the second semiconductor chip having a second height in the thickness direction and being spaced apart from the first semiconductor chip in a width-wise direction perpendicular to the thickness direction;

a first conductive film provided on the first surface of the film substrate and covering the bridge region, the first semiconductor chip and the second semiconductor chip, the first conductive film comprising:
   a first side; and
   a second side opposite to the first side in a plan view of the COF package; and
a second conductive film provided on the second surface of the film substrate,
wherein the first conductive film further comprises a notch cut out from at least one of the first and second sides of the first conductive film, the notch being provided in a portion of the first conductive film covering the bridge region of the film substrate, and
wherein a depth of the notch in a depth-wise direction being perpendicular to the thickness direction and the width-wise direction is greater than the first height and the second height.

2. The chip on film package of claim 1, wherein the notch comprises:
   a first notch at the first side of the first conductive film; and
   a second notch at the second side of the first conductive film.

3. The chip on film package of claim 1, wherein the first conductive film has a thermal conductivity greater than those of the first and second semiconductor chips.

4. The chip on film package of claim 1, wherein the second conductive film overlaps at least one of the first semiconductor chip and the second semiconductor chip in a plan view of the COF package.

5. The chip on film package of claim 1, further comprising:
   wiring lines provided on the first surface of the film substrate and connected to the first semiconductor chip; and
   a protection layer between the wiring lines and the first conductive film.

6. The chip on film package of claim 5, wherein each of the wiring lines has an end portion, the end portion exposed by the first conductive film.

7. The chip on film package of claim 1, further comprising:
   a lower adhesive film disposed between the first conductive film and the first surface of the film substrate, between the first conductive film and the first semiconductor chip, and between the first conductive film and the second semiconductor chip;
   an upper adhesive film on the first conductive film; and
   a protective film on the upper adhesive film.

8. The chip on film package of claim 1, further comprising:
   a first underfill layer between the film substrate and the first semiconductor chip; and
   a second underfill layer between the film substrate and the second semiconductor chip.

9. The chip on film package of claim 1, wherein the first and second conductive film has a thermal conductivity of 200 W/m·K to 100,000 W/mK.

10. A film package comprising:
   a film substrate;
   a first semiconductor chip provided on a first surface of the film substrate and having a first height in a thickness direction of the film substrate;
   a second semiconductor chip provided on the first surface of the film substrate, having a second height in the thickness direction and being spaced apart from the first semiconductor chip in a first direction being perpendicular to the thickness direction; and
   a first film structure provided on the first surface of the film substrate and covering the first semiconductor chip, the second semiconductor chip and a bridge region between the first and second semiconductor chips,
   wherein the first film structure has a notch provided on the bridge region between the first and second semiconductor chips, the notch being cut out from at least one of a plurality of sides of a first conductive film, and
   wherein a depth of the notch in a second direction being perpendicular to the thickness direction and the first direction is greater than the first height and the second height,
   wherein the first film structure comprises:
      a first lower adhesive film covering the first semiconductor chip and the second semiconductor chip;
      the first conductive film comprising a metal or a carbon-containing material and provided on the first lower adhesive film;
      a first upper adhesive film on the first conductive film; and
      a first protective film on the first upper adhesive film.

11. The film package of claim 10, further comprising
   a first output wiring line and a first input wiring line provided on the first surface of the film substrate and electrically connected to the first semiconductor chip; and
   a second output wiring line and a second input wiring line provided on the first surface of the film substrate and electrically connected to the second semiconductor chip,
   wherein an end of the first output wiring line, an end of the first input wiring line, an end of the second output wiring line, and an end of the second input wiring line are exposed by the first film structure.

12. The film package of claim 11, wherein the end of the first output wiring line and the end of the second output wiring line are adjacent to one side of the film substrate, and
   wherein the end of the first input wiring line and the end of the second input wiring line are adjacent to another side of the film substrate.

13. The film package of claim 11, further comprising:
   a protection layer covering at least one of the first output wiring line, the first input wiring line, the second output wiring line, and the second input wiring line,
   wherein the first film structure is disposed on the protection layer.

14. The film package of claim 10, further comprising:
   a second film structure provided on a second surface of the film substrate and overlapping at least one of the first semiconductor chip and the second semiconductor chip in a plan view of the film package, the second surface opposite to the first surface.

15. The film package of claim 14, wherein the second film structure comprises:
   a second conductive film comprising a metal or a carbon-containing material;
   a second lower adhesive film between the second surface of the film substrate and a first surface of the second conductive film;
   a second protective film on a second surface of a second upper adhesive film; and
   the second upper adhesive film between the second conductive film and the second protective film.

16. A film package comprising:
a film substrate comprising:
- a first chip region provided on a first surface of the film substrate;
- a second chip region provided on the first surface; and
- a bridge region provided between the first and second chip region on the first surface;

a first semiconductor chip provided on the first chip region of the film substrate and having a first height in a thickness direction of the film substrate;

a second semiconductor chip provided on the second chip region of the film substrate, the second semiconductor chip being spaced apart from the first semiconductor chip in a widthwise direction of the film substrate;

a first output wiring line electrically connected to the first semiconductor chip and having an end portion are adjacent to one side of the film substrate;

a first input wiring line electrically connected to the first semiconductor chip and having an end portion are adjacent to another side of the film substrate;

a second output wiring line electrically connected to the second semiconductor chip and having an end portion are adjacent to the one side of the film substrate;

a second input wiring line electrically connected to the second semiconductor chip and having an end portion are adjacent to the another side of the film substrate; and a film structure provided on the film substrate and covering the first semiconductor chip, the second semiconductor chip and the bridge region of the film substrate, the film structure comprising:

- a first side; and
- a second side opposite to the first side in a plan view of the film package, wherein the film structure has a first notch cut out from at least one of the first and second sides of the film structure, the first notch being provided in a portion of the film structure covering the bridge region of the film substrate, wherein a depth of the first notch in a depth-wise direction being perpendicular to the thickness direction and the widthwise direction is greater than the first height, wherein a thermal conductivity of the film structure is greater than those of the first and second semiconductor chips.

17. The film package of claim 16, wherein the end of the first output wiring line, the end of the first input wiring line, the end of the second output wiring line, and the end of the second input wiring line are exposed by the film structure.

18. The film package of claim 16, wherein the film structure further has a second notch at the second side of the film structure in the portion of the film structure covering the bridge region of the film substrate.

19. The film package of claim 16, wherein film structure further comprises a lower adhesive film being in contact with the first semiconductor chip and the second semiconductor chip, and
wherein the film structure is provided on the lower adhesive film.

20. The film package of claim 16, wherein film structure further comprising:
an upper adhesive film on the conductive film; and
a protective film on the upper adhesive film.

* * * * *